(12) United States Patent
Andre et al.

(10) Patent No.: US 10,269,405 B2
(45) Date of Patent: Apr. 23, 2019

(54) WRITE VERIFY PROGRAMMING OF A MEMORY DEVICE

(71) Applicant: EVERSPIN TECHNOLOGIES, INC., Chandler, AZ (US)

(72) Inventors: Thomas Andre, Austin, TX (US); Dimitri Houssameddine, Gilbert, AZ (US); Syed M. Alam, Austin, TX (US); Jon Slaughter, Chandler, AZ (US); Chitra Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 11 days.

(21) Appl. No.: 15/605,508

(22) Filed: May 25, 2017

(65) Prior Publication Data
US 2017/0263300 A1    Sep. 14, 2017

Related U.S. Application Data

(63) Continuation of application No. 14/502,367, filed on Sep. 30, 2014, now Pat. No. 9,679,627.

(51) Int. Cl.
*G11C 11/00* (2006.01)
*G11C 11/16* (2006.01)
*G06F 12/0804* (2016.01)

(52) U.S. Cl.
CPC ...... *G11C 11/1675* (2013.01); *G11C 11/1677* (2013.01); *G06F 12/0804* (2013.01); *Y02D 10/13* (2018.01)

(58) Field of Classification Search
CPC ... G11C 11/1675; G11C 11/1659; G11C 5/02; G11C 13/003; G11C 2013/0071; G11C 11/1677; Y02D 10/12; G06F 12/0804
USPC ........................................................ 365/158
See application file for complete search history.

(56) References Cited

U.S. PATENT DOCUMENTS

| | | | |
|---|---|---|---|
| 8,000,127 B2 | 8/2011 | Hamilton et al. | |
| 8,179,711 B2 | 5/2012 | Kim et al. | |
| 8,619,474 B2 | 12/2013 | Goda et al. | |
| 9,047,969 B2 | 6/2015 | Alam et al. | |
| 9,679,627 B2 | 6/2017 | Andre et al. | |
| 2009/0168493 A1 | 7/2009 | Kim et al. | |
| 2011/0038195 A1* | 2/2011 | Hamilton | B82Y 10/00 365/148 |
| 2011/0058424 A1 | 3/2011 | Goda et al. | |
| 2011/0122697 A1* | 5/2011 | Jang | G11C 16/0483 365/185.12 |
| 2011/0188292 A1 | 8/2011 | Joo et al. | |
| 2012/0195112 A1 | 8/2012 | Alam et al. | |

(Continued)

*Primary Examiner* — Xiaochun L Chen
(74) *Attorney, Agent, or Firm* — Bookoff McAndrews, PLLC

(57) ABSTRACT

A memory device is configured to identify a set of bit cells to be changed from a first state to a second state. In some examples, the memory device may apply a first voltage to the set of bit cells to change a least a first portion of the set of bit cells to the second state. In some cases, the memory device may also identify a second portion of the bit cells that remained in the first state following the application of the first voltage. In these cases, the memory device may apply a second voltage having a greater magnitude, duration, or both to the second portion of the set of bit cells in order to set the second portion of bit cells to the second state.

22 Claims, 14 Drawing Sheets

(56) References Cited

U.S. PATENT DOCUMENTS

| | | | |
|---|---|---|---|
| 2012/0327714 A1* | 12/2012 | Lue | G11C 5/02 |
| | | | 365/185.17 |
| 2014/0112068 A1 | 4/2014 | Goda et al. | |
| 2014/0177316 A1 | 6/2014 | Otsuka et al. | |
| 2015/0006997 A1 | 1/2015 | Alam et al. | |
| 2015/0187420 A1 | 7/2015 | Lee | |
| 2015/0243337 A1 | 8/2015 | Alam et al. | |
| 2015/0279458 A1 | 10/2015 | Papandreou et al. | |

* cited by examiner

WRITE VERIFY PROGRAMMING OF A MEMORY DEVICE

This application is a continuation application of pending U.S. patent application Ser. No. 14/502,367, filed on Sep. 30, 2014, which is incorporated herein by reference in its entirety.

BACKGROUND

In magnetic memory devices, such as magnetic random access memory (MRAM) devices, the energy consumption rate of an MRAM may be higher than comparable non-magnetic memory devices, such as dynamic random access memory (DRAM) devices. Likewise, the reliability rate of an MRAM device may be lower than a comparable DRAM devices and other non-magnetic memory devices. In some instances, the high energy consumption rate and lower reliability rate of MRAM devices are related to the higher voltage and/or current required to read and write data bits associated with the MRAM devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
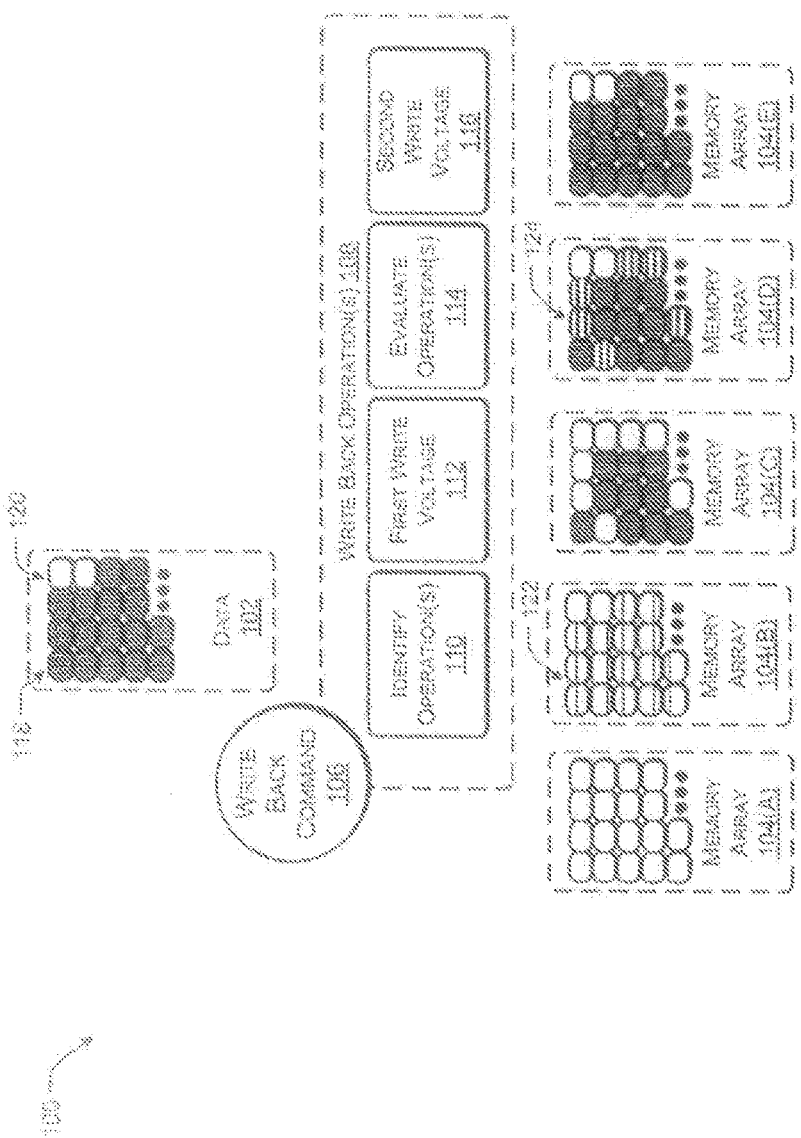
FIG. 1 illustrates an example diagram associated with writing data into bit cells of a memory array according to some implementations.

This disclosure includes techniques and implementations to improve the reliability and energy consumption rates associated with accessing data stored in magnetic memory devices. For example, in some types of magnetic memory devices the data is stored by maintaining a desired state on a magnetic tunnel junction (MTJ) or a differential state between pairs of MTJs. The states of each bit of the memory device are typically set or switched by applying a voltage across a corresponding MTJ. Unfortunately, repeatedly applying voltages across the MTJs may, in some cases, lead to dielectric breakdown of the tunnel barrier, thereby rendering the bit cell unusable (e.g., the restive state of the bit cell may become fixed) and reducing the reliability and the device lifetime of the memory device.

Additionally, the voltage required to switch or set each MTJ may fluctuate based on a natural variation in the resistance of each MTJ, as well as the resistive state of each MTJ. Unfortunately, in some devices to ensure each bit switches correctly, the voltage used to set or switch the bit cells, is a voltage having a magnitude and/or duration greater than the magnitude and/or duration required to switch an MTJ with average resistance. Additionally, in some cases when a bit cell is in a high resistive state, the voltage applied across the tunnel junction from the write pulse is increased compared to when the bit cell is in a low resistive state. Thus, for many of the MTJs, the voltage applied is of greater magnitude and/or length than necessary. By applying the over voltage, the power consumption associated with each write is increased, thereby increasing the overall power consumption of the device, while the MTJs experience accelerated breakdown of the tunnel barriers, thereby further reducing reliability of the memory device.

In some examples, the memory device may be configured to respond to commands from an external source accessing the data in the memory device in a predetermined series or sequence to accomplish one or more read and/or write operations. The series of commands and operations may include a precharge command, an activate command, and read/write commands. For example, the precharge command is issued to cause the memory device to close an open page by, for instance, writing data stored in a cache into the bit cells of a memory array. The activate command is issued to cause the memory device to open a page by, for instance, loading data from the bit cells of the memory array into the cache. One or more read/write commands are issued between the activate and precharge command to read and/or edit the data stored in the cache.

In some implementations, described herein, the memory device may be configured to read data to be written into a memory array from a cache in response to receiving a precharge command. In some cases, the memory device may identify a state associated with each of the bit cells in the memory array. The memory device may then determine a first set of bits in the memory array to be written to a high resistive state and a second set of bits in the memory array to be written to a low resistive state based at least in part on the data to be written into the memory array and the current state of each bit cell.

With respect to the first set of bits, the memory device may be configured to apply a first up voltage across the tunnel junctions of the bit cells of the first set of bit cells to set at least a portion of the first set of bit cells to the high resistive state. The memory device may then evaluate the state of the first set of bit cells (for example, via a referenced read operation) to identify a first subset of the first set of bit cells remaining in the low resistive state. Once the first subset is identified, the memory device may apply a second up voltage across the tunnel junctions associated with the bit cells of the first subset. In general, the second up voltage may be configured to have a larger magnitude and/or duration than the first up voltage. In this manner, the MTJs having a higher natural resistance may be switched by the first up voltage having the lower magnitude and/or reduced duration. The second up voltage may be then be applied by the memory device to ensure the MTJs having a lower natural resistance are set or switched to the desired state (e.g., in this case the high resistive state). In this manner, the memory device is able to reduce the risk and speed at which at least some the MTJs are broken down or shorted, thereby extending the usable life of the device.

With respect to the second set of bits, the memory device may be configured to apply a first down voltage across the tunnel junctions of the bit cells of the second set of bit cells to set at least a portion of the second set of bit cells to the low resistive state. The memory device may then evaluate the state of the second set of bit cells (for example, via a referenced read operation) to identify a second subset of the second set of bit cells remaining in the high resistive state. Once the second subset is identified, the memory device may apply a second down voltage across the tunnel junctions associated with the bits of the second subset. In general, the second down voltage has a larger magnitude and/or pulse length than the first down voltage. Thus as described above, the MTJs having a higher natural resistance may be switched by the first down voltage having the lower magnitude and/or reduced duration. The second down voltage may be then be applied by the memory device to ensure the MTJs having a lower natural resistance are set or switched to the desired state (e.g., in this case the low resistive state). In this manner, the memory device is able to reduce the risk and speed at which at least some the MTJs are broken down or shorted, thereby extending the usable life of the device.

In another implementation, the memory device may be configured to reset the state of each of the bit cells to a particular state (e.g., either the high resistive state or low resistive state) before writing the data into the memory array, such that each bit cell is in the same state when the precharge command is received. For example, the memory device may be configured to perform self-referencing reads, which may require switching each bit cell to the particular state as the data in the memory array is read into the cache.

For instance, in some memory devices that perform self-referenced reads a change in state of each bit cell may be identified, while the difference between the states (e.g., either the high resistive state or the low resistive state) may be difficult to distinguish. Therefore, the memory device may be configured to first sample state information (such as measuring a current when a bias voltage is applied) of each bit cell and store the state information. The memory device may then apply a predetermined voltage (either up or down) across the tunnel junctions of each bit being read from the array to switch all of the bits to the same state (for example, the low resistive state). After the voltage is applied, the memory device may evaluate each bit cell to identify state information (for instance, by again biasing the bit cells and measuring the current). The memory device may then compare the state information to the stored state information to identify a set of bit cells that changed state. In this manner, the memory device may identify the original states of the bit cells.

In this instance, the memory device may be configured to apply a predetermined scheme to identify which bits are in the high resistive state and which are the low resistive state. For example, the memory device may be configured to place each bit cell in a low resistive state by applying a down voltage. Therefore, any bit cell that state changed may be read as a high value or a high resistive state and any bit cells that state remained the same may be read as a low value or a low resistive state.

In the present example, when the memory device receives a precharge command to write the data back into the memory array, the memory device may only switch bit cells or apply voltages to bit cells being placed in the high resistive state, as each of the bit cells were placed in the low resistive state following the operations performed in response to the activate command. Therefore, in this example, the memory device may first determine a set of bits to be written to a high resistive state based on the data stored in the cache. The memory device may then apply a first up voltage across the tunnel junctions of the bit cells of the set of bits to set at least a portion of the bit cells to the high resistive state. The memory device may then evaluate the state of the set of bit cells to identify a subset of the set of bit cells remaining in the low resistive state.

Once the subset is identified, the memory device may apply a second up voltage across the tunnel junctions associated with the bit cells of the subset. The second up voltage may have a larger magnitude and/or duration than the first up voltage to ensure the bit cells of the subset are switched to the high resistive state. In this manner, the MTJs having a higher natural resistance may be switched by the first up voltage having the lower magnitude and/or duration, while the MTJs having a low natural resistance may be switched by the second up voltage.

In some implementations, multiple reset voltages may be utilized as part of the operations associated with the activate command or writing data into the cache. For example, if the memory device is utilizing self-referenced reads, as described above, the memory device may apply voltages across the tunnel junctions in a manner similar to writing the data from the cache into the memory array. Similarly to the up and down voltages applied when writing the data, the reset voltages applied when reading the data increase the overall energy consumption of the memory device and contribute to the dielectric breakdown of the MTJs.

In this implementation, the memory device may be configured to sample a state of each bit cell (e.g., either the first resistive state or the second resistive state) and store the state information, as described above. The memory device may then apply a first reset voltage across the tunnel junctions of each bit being read from the memory array to switch all of the bits to the same state (for instance, to the first resistive state). After the voltage is applied, the memory device may evaluate the state of each bit cell and compare the current state (e.g., the first resistive state or the second resistive state) to the stored state to identify a subset of bit cells in the array whose state did not change. In this implementation, the first reset voltage may be a voltage having either magnitude or duration that is estimated to be insufficient to switch every bit in the memory array and, therefore, the subset of bit cells whose state did not change may include both bit cells that were already in the first resistive state, as well as bit cells in the second resistive state that the first reset voltage failed to switch.

The memory device may then apply a second reset voltage having a larger magnitude and/or longer duration to the bit cells identified in the subset of bit cells to switch the bit cells that remained in the second resistive state. Following the second voltage, the memory device may again evaluate the state of each bit cell and compare the current state (e.g., first resistive state or second resistive state) to the stored state to identify which bit cells changed state (e.g., from the second resistive state to the first restive state) and which bit cells did not change state (e.g., stayed in the first resistive state).

As discussed above, once the bit cells that changed state and the bit cells that did not change state are identified, the memory device may apply a predetermined scheme to identify which bits are high and which are low. For example, the memory device may be configured to identify any bit cell whose state changed (e.g., form second resistive state to first resistive state) as a high value and any bit cells whose state remained the same (e.g., from first resistive state to first resistive state) as a low value.

Additionally, in some implementations, multiple voltages may be applied as part of the operations associated with both writing and reading data from a memory array, as described above, to further improve the overall power rating and failure rates of the memory device. It should also be understood, that the operations associated with writing and reading the data may include applying additional voltages. In the illustrated examples, the memory device is discussed with respect to applying a first voltage and second voltage having a different magnitude, duration, or both. However, in some implementations, additional voltages (e.g., a third voltage, fourth voltage, etc.) and additional sample/evaluate operations may be implemented by the memory device to further refine or improve the overall power consumption and lifetime associated with the memory device. For example, the memory device may be configured to apply a first voltage at a magnitude, duration, or both estimated to switch about 90% of the bit cells, a second voltage at a magnitude, duration, or both estimated to switch about 99% of the bit cells, a third voltage at a magnitude, duration, or both estimated to switch about 99.9% of the bit cells, and fourth voltage at a magnitude, duration, or both estimated to reliably switch 100% of the bit cells.

FIG. 1 illustrates an example diagram 100 associated with writing data 102 into bit cells of a memory array 104 according to some implementations. For example, the diagram 100 may illustrate events associated with an external source (e.g., a memory device controller) writing data 102 to be stored within a memory array 104 of a memory device, such as an MRAM device. For instance, in the illustrated example, the memory device receives a write back command 106 (or in some implementations a precharge command) from the external source to write the data 102 stored in a cache into the bit cells of the memory array 104. In other implementations, the memory device may receive the data 102 to be written into bit cells of the memory array 104 as part of a stream of data.

In general, the bit cells of the memory array 104 are shown at various points in time, as the write back operations 108 are performed by the memory device. For example, memory array 104(A) illustrates the state of the bit cells prior to receiving the write back command 106, memory array 104(B) illustrates the state of the bit cells following the completion of the identify operations 110, memory array 104(C) illustrates the state of the bit cells following the application of the first write voltage 112, memory array 104(D) illustrates the state of the bit cells following the completions of the evaluate operations 114, and memory array 104(E) illustrates the state of the bit cells following the application of the second write voltage 116.

In the illustrated example, the data bits of the data 102 and the bit cells of the memory array 104 are shown as either light or dark. In this example, a darkened bit is representative of a high resistive state or a value of one and a light bit is representative of a low resistive state or a value of zero.

In general, the memory device first preforms identify operations 110 on the data 102 to determine a current state associated with each data bit. For instance, with regard to the illustrated example, a first portion of the data bits, generally indicated by 118, of the data 102 are dark and, therefore, representative of a value of one or a high resistive state. Similarly, a second portion of the bits, generally indicated by 120, of the data 102 are light and, therefore, representative of a value of zero or a low resistive state.

Additionally, in the illustrated example, the memory device may be able to identify the current state associated with each of the bit cells. For instance, if the memory device incorporates self-referenced reads, each of the bit cells of the memory array 104 may be set to a particular resistive state (for example, the low resistive state) when the data is read. Therefore, each bit cell remains in the particular resistive state when data is written back into the memory array 104. For instance, in the illustrated example, each of the bit cells of the memory array 104(A) are initially set to the low resistive state.

Once the state of the data bits and the bit cells of memory array 104(A) are known, the memory device may determine a set of bits, generally indicated by 122 and illustrated with a horizontal shading on the data bits of memory array 104(B), to be written to a high resistive state. The set of data bits 122 are selected in some instances based on a determination that a state of the bit cells of the memory array 104(A) differs from the state of the corresponding data 102. For example, the memory device may identify a bit cell corresponding to each of the bits of the data 102 having a value of one or a value representative of the high resistive state and include each identified bit cell in the set of bit cells 122.

The memory device may apply a first write voltage 112 across the tunnel junctions of the bit cells of the set of bits 122 (e.g., the bit cells illustrated with the horizontal shading in memory array 104(B)) to set at least a portion of the bit cells of the set of bits 122 to the high resistive state, as illustrated by 104(C). In some implementations, applying the first write voltage 112 may include applying a voltage having a first predetermined magnitude across the tunnel junctions of the bit cells. In other implementations, applying the first write voltage 112 may include applying a voltage for a first predetermined duration across the tunnel junctions of the bit cells. In still other implementations, applying the first write voltage 112 may include applying a voltage having both the first predetermined magnitude and the first predetermined duration across the tunnel junctions of the bit cells.

In some examples, the first predetermined magnitude of the first voltage may be set at a voltage level estimated to switch the state of less than one hundred percent of the bit cells. For example, the voltage level may be estimated to switch the state associated with about eighty five percent of the bit cells, ninety percent of the bit cells, ninety five percent of the bit cells, ninety nine percent of the bit cells, ninety nine point nine percent of the bit cells, etc. Likewise, the first predetermined duration of the first voltage may be set at a period of time estimated to switch the state of less than one hundred percent of the bit cells, for example, the period may be set to a length estimated to switch the state associated with about eighty five percent of the bit cells, ninety percent of the bit cells, ninety five percent of the bit cells, ninety nine percent of the bit cells, ninety nine point nine percent of the bit cells, etc. In some cases, the combination of the first predetermined magnitude and the first predetermined duration may be configured jointly to cause a predetermined percentage of the bit cells to change state.

After applying the first write voltage 112, the memory device may perform one or more evaluate operations 114 to the bit cells of the set of bit cells 122 or in some cases, to each of the bit cells in the memory array 104. The evaluate operations 122 are configured to identify a subset of bit cells, generally indicated by 124 and illustrated with a darkened horizontal shading in memory array 104(C), remaining in the low resistive state after the first write voltage 112 was applied. For example, the memory device may perform referenced read operations on the bit cells associated with the set of bit cells 122 to determine if any remained in the low resistive state. In general, the subset of bit cells 124 include the bit cells of the set of bit cells 122 that the first write voltage 112 did not cause to switch from the low resistive state to the high resistive state. For example, since the first write voltage 112 may have a first predetermined magnitude and/or a first predetermined duration that are configured such that a state of at least some portion of the bit cells of the memory array 104 would not switch states, it is possible that one or more bit cells of the set of bit cells 122 did not switch to the high resistive state. For instance, in the illustrated example, six bit cells failed to switch to the high resistive state following the application of the first write voltage 112.

If at least one bit cell of the set of bit cells 122 remained in the low resistive state, the memory device may apply a second write voltage 116 across the tunnel junctions associated with the bit cells of the subset 124. The second write voltage 116 may have a second predetermined magnitude, may be applied for a second predetermined duration, and/or both. In some cases, the second predetermined magnitude may be a larger than the first predetermined magnitude associated with the first write voltage 112 and the second predetermined duration may be larger than the first predetermined duration associated with the first write voltage 112. For example, the second predetermined magnitude may be set to a voltage level estimated to reliably switch the state of one hundred percent of the bit cells. Similarly, the second predetermined duration may be set to a period of time sufficient to reliably switch the state of one hundred percent of the bit cells of the memory array 104.

In some particular cases, the second write voltage 116 may be configured such that the combination of the second predetermined magnitude and the second predetermined duration is sufficient to switch the state of each of the bit cells of the memory array 104 not already in the high resistive state. Thus, the second write voltage 116 having a larger magnitude and/or duration ensures that the bit cells of the subset 124 (e.g., the bit cells whose state was not switched in response to first write voltage 112) are set to the high resistive state. For example, in the illustrated example, following the application of the second write voltage 116, the bit cells of the memory array 104(D) are placed in a state corresponding to the state of the bits of the data 102 being written, as shown in the memory array 104(E).

By applying a first write voltage 112 and a second write voltage 116 in the manner describe above, the second write voltage 116 having a larger magnitude and/or duration may be applied to a smaller portion or number of the bit cells, as the first write voltage 112 with a smaller magnitude and/or duration switched at least a portion of the bit cells. Additionally, if each of the bit cells of the set of bit cells 120 switched after the application of the first write voltage 112 than the second write voltage 116 may be unnecessary. In this manner, the memory device is able to experience reduced power consumption, as low voltages for a shorter period may be used to switch the state of at least a portion of the bit cells. The memory device may also experience improved reliability, as less voltage is applied across the tunnel junction of at least a portion of the bit cells slowing a rate associated with the dielectric break down of the MTJs.

Figure 2:
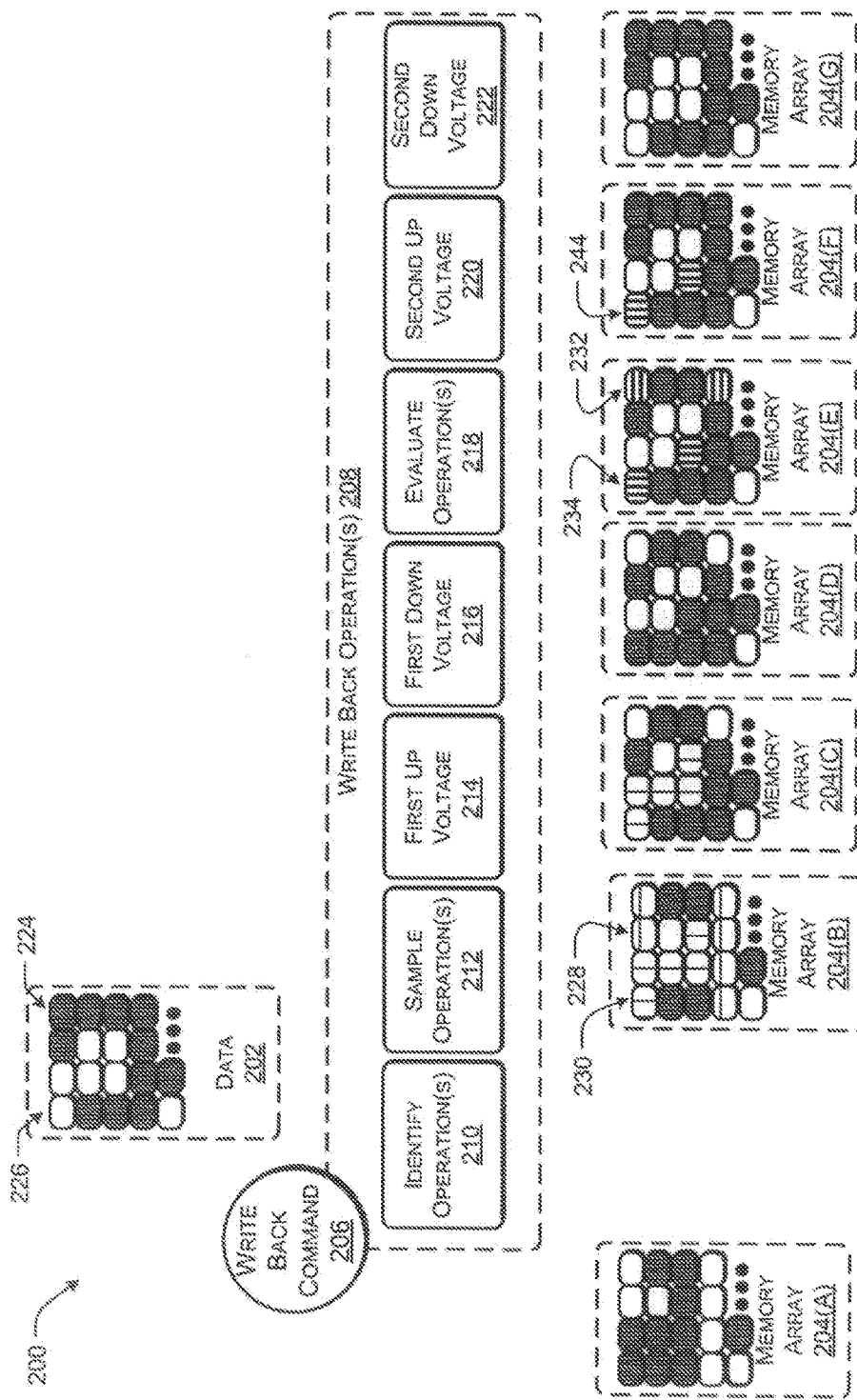
FIG. 2 illustrates another example diagram associated with writing data into bit cells of a memory array according to some implementations.

FIG. 2 illustrates another example diagram 200 associated with writing data 202 into bit cells of a memory array 204 according to some implementations. For example, the diagram 200 may illustrate events associated with an external source (e.g., a memory device controller) writing data to be stored within a memory device, such as an MRAM device. For instance, in the illustrated example the memory device receives a write back command 206 from the external source to write data 202 stored in a cache to the memory array 204. However, in other implementations, the memory device may start the write back operations 208 in response to receiving the data 202 without any additional commands.

In general, the bit cells of the memory array 204 are shown at various points in time, as the write back operations 208 are performed by the memory device. For example, memory array 204(A) illustrates the state of the bit cells prior to receiving the write back command 206. Memory array 204(B) illustrates the state of the bit cells following the completion of the identify operations 210 and the sample operations 212. Memory array 204(C) illustrates the state of the bit cells following the application of the first up voltage 214. Memory array 204(D) illustrates the state of the bit cells following the application of the first down voltage 216. Memory array 204(E) illustrates the state of the bit cells following the completion of the evaluate operations 218. Memory array 204(F) illustrates the state of the bit cells following the application of the second up voltage 220. Memory array 204(G) illustrates the state of the bit cells following the application of the second down voltage 222.

In the illustrated example, the data bits of the data 202 and the bit cells of the memory array 204 are shown as either light or dark. In this example, assume that a darkened bit is representative of a high resistive state or a value of one and a light bit is representative of a low resistive state or a value of zero. In general, the memory device first performs identify operations 210 on the data 202 to determine a current state associated with each data bit. For instance, with regards to the illustrated example, a first portion of the bits, generally indicated by 224, of the data 202 are dark and, therefore, representative of a value of one or a high resistive state. Similarly, a second portion of the bits, generally indicated by 226, of the data 202 are light and, therefore, representative of a value of zero or a low resistive state.

In the illustrated example, the memory device also performs sample operations 212 on the bit cells to identify a current state associated with each of the bit cells of the memory array 204(A). For example, the memory device may sample the current state of each bit cell by preforming a referenced read operation and/or by applying a voltage to each of the bits cells and determining an associated resistance.

Once the state of each bit of the data 202 and the current state of the each bit cell within the memory array 204(A) are identified, the memory device may identify a first set of bits, generally indicated by 228 and illustrated by a horizontal shading in memory array 204(B), to be written to a high resistive state. The memory device also identifies a second set of bits, generally indicated by 230 and illustrated by a vertical shading in the memory array 204(B), to be written to a low resistive state. For example, the memory device may identify the first set of bits 228 and the second set of bits 230 by comparing the current state of the bit cells to the state of the bits of the data 202 to be written.

In the illustrated example, the memory device may be configured to apply the first up voltage 214 to switch at least a portion of the first set of bit cells 228 to the high resistive state and the first down voltage 216 to switch at least a portion of the second set of bit cells 230 to the low resistive state. For example, the first up voltage 214 may have a first predetermined magnitude and/or be applied for a first predetermined duration and the first down voltage 216 may have a second predetermined magnitude and/or be applied for a second predetermined duration.

In some examples, the first predetermined magnitude and the second predetermined magnitude may be the same but applied across the tunnel junctions in different directions. In other examples, the first predetermined magnitude and the second predetermined magnitude may differ, for instance, when a voltage level associated with switching the bit cells from the high resistive state to the low resistive state is different from a voltage level associated with switching the bit cells from the low resistive state to the high resistive state. Likewise, in some cases, the first predetermined duration and the second predetermined duration may be the same. In other cases, the first predetermined duration and the second predetermined duration may differ, for instance, when switching bit cells from the high resistive state to the low resistive state requires longer duration than switching the bit cells from the low resistive state to the high resistive state or vice versa.

As described above, the first predetermined magnitude and the second predetermined magnitude may be set at a voltage level to switch the state of less than one hundred percent of the bit cells of the memory array 204 to reduce the destructiveness of the first up voltage 214 and the first down voltage 216 (e.g., slow the dielectric breakdown of the tunnel junctions). Likewise, the first predetermined duration and the second predetermined duration may be set at a period estimated to switch the state of less than one hundred present of the bit cells to again reduce the destructiveness of the first up voltage 214 and the first down voltage 216.

In the illustrative example, the first up voltage 214 is shown as being applied to the first set of data bits 228 before the first down voltage 216 is applied to the second set of data bits 230. However, the order associated with the first up voltage 214 and the first down voltage 216 shown in the current example is merely for illustrative purposes. For example, the first down voltage 216 may be applied before the first up voltage 214. In other examples, the first up voltage 214 and the first down voltage 216 may be applied in multiple pulses, which may be interleaved.

Once the first up voltage 214 is applied to the first set of bit cells 228 and the first down voltage 216 is applied to the second set of bit cells 230, the memory device may perform evaluate operations 218 to determine a state of the bits cells associated with both the first set of bit cells 228 and the second set of bit cells 230. For example, the memory device may compare a resistance (or current) stored at the time the sample operations 212 were performed with a current resistance (or current) identified as part of the evaluate operations 218 to determine if the state of the bit cells changed.

The memory device may identify a first subset of bit cells, generally indicated by 232 and illustrated by the darkened horizontal shading in the memory arrays 204(C)-(E). In general, the first subset of bit cells 232 may be bit cells of the first set of bit cells 228 that remained in the low resistive state after the first up voltage 214 was applied (e.g., bit cells that failed to switch from the low resistive state to the high resistive state). Likewise, the memory device may identify a second subset of bit cells, generally indicated by 234 and illustrated by the darkened vertical shading in the memory arrays 204(D)-(F). The second subset of bit cells 234 may be bit cells of the second set of bit cells 230 that remained in the high resistive state after the first down voltage 216 was applied (e.g., bit cells that failed to switch from the high resistive state to the low resistive state).

Once the first subset 232 and second subset 234 are identified, the memory device may apply the second up voltage 220 to switch the remaining bit cells of the first subset 232 from the low resistive state to the high resistive state. The memory device may also apply the second down voltage 222 to switch the remaining bit cells of the second subset 234 from the high resistive state to the low resistive state. For example, the second up voltage 220 may have a larger magnitude and/or be applied for a longer duration than the first up voltage 214 to ensure the remaining bit cells of the first subset 228 are set to the high resistive state. The second down voltage 222 may have a larger magnitude and/or be applied for a longer duration than the first down voltage 216 to ensure the remaining bit cells of the second set of bit cells 230 are set to the low resistive state. Thus as described above, the MTJs having a higher natural resistance may be switched by the first up voltage 214 or the first down voltage 216 reducing the risk and speed at which at least some of the tunnel junctions are broken down or shorted. Then the second up voltage 220 and the second down voltage 222 may be applied to ensure the MTJs having a lower natural resistance are set or switched to the desired state and the data 202 is stored correctly, as shown in the memory array 204(G).

Figure 3:
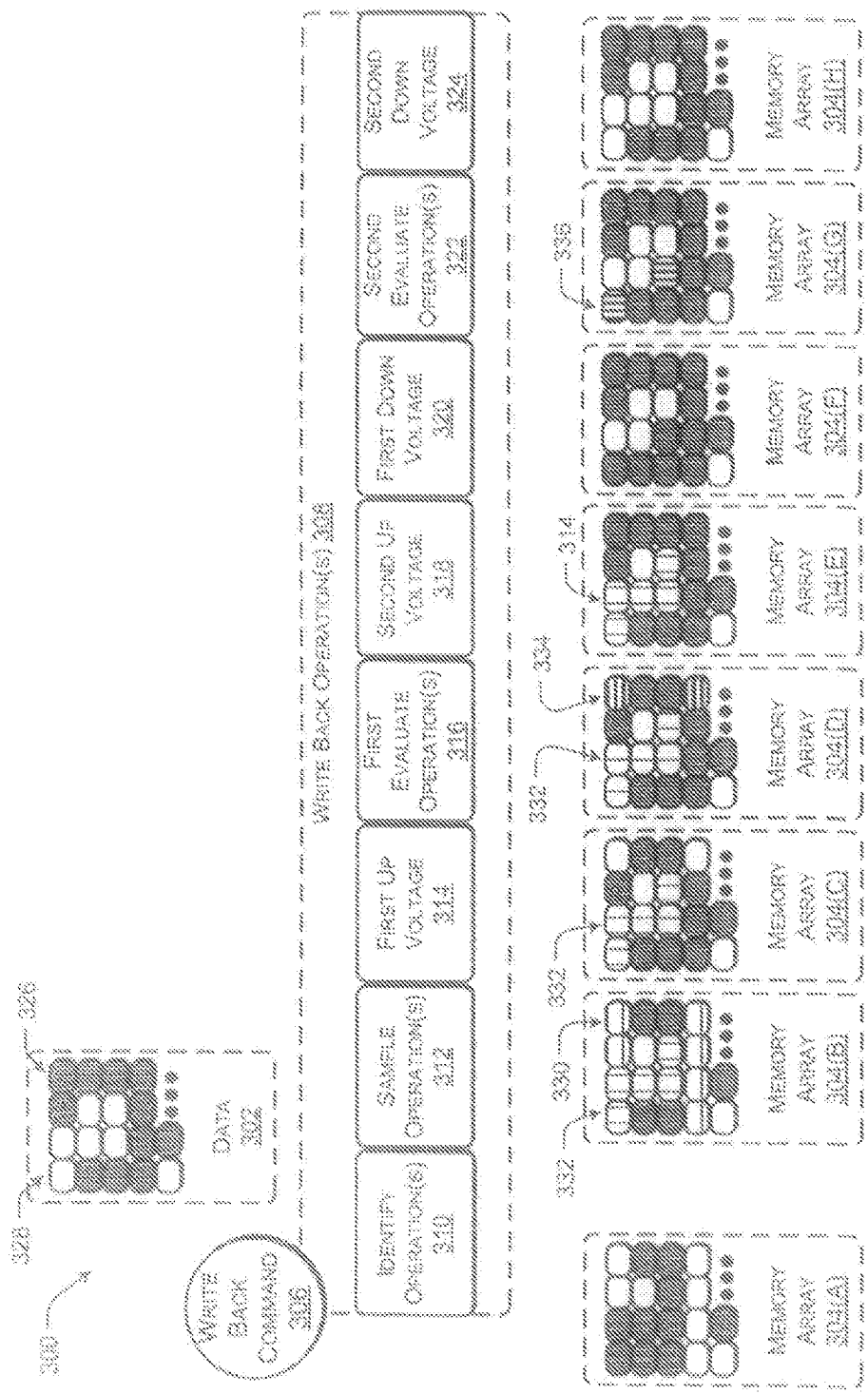
FIG. 3 illustrates another example diagram associated with writing data into bit cells of a memory array according to some implementations.

FIG. 3 illustrates another example diagram 300 associated with writing data 302 into bit cells of a memory array 304 according to some implementations. For example, the diagram 300 may illustrate events associated with an external source (e.g., a memory device controller) writing data to be stored within a memory device, such as an MRAM device. For instance, in the illustrated example the memory device receives a write back command 306 from the external source to write data 302 stored in a cache to the memory array 304. However, in other implementations, the memory device may receive the data 302 to be written into bit cells of the memory array 304 as part of a stream of data.

In general, the bit cells of the memory array 304 are shown at various points in time, as the write back operations 308 are performed by the memory device. For example, memory array 304(A) illustrates the state of the bit cells prior to receiving the write back command 306. Memory array 304(B) illustrates the state of the bit cells following the completion of the identify operations 310 and the sample operations 312. Memory array 304(C) illustrates the state of the bit cells following the application of the first up voltage 314. Memory array 304(D) illustrates the state of the bit cells following the completions of the first evaluate operations 316. Memory array 304(E) illustrates the state of the bit cells following the application of the second up voltage

318. Memory array 304(F) illustrates the state of the bit cells following the application of the first down voltage 320. Memory array 304(G) illustrates the state of the bit cells following the completion of the second evaluate operations 322. Memory array 304(H) illustrates the state of the bit cells following the application of the second down voltage 324.

In the illustrated example, the data bits of the data 302 and the bit cells of the memory array 304 are shown as either light or dark. In this example, assume that a darkened bit is representative of a high resistive state or a value of one and a light bit is representative of a low resistive state or a value of zero. In general, the memory device first performs a read operation 310 on the data 302 to identify a state associated with each data bit. For instance, with regards to the illustrated example, a first portion of the data bits, generally indicated by 326, of the data 302 are dark and, therefore, representative of a value of one or a high resistive state. Similarly, a second portion of the bits, generally indicated by 328, of the data 302 are light and, therefore, representative of a value of zero or a low resistive state.

In the illustrated example, the memory device also identifies the bit cells of the memory array 304 that the data 302 is being written to and performs sample operations 312 on the bit cells to identify a current state associated with each of the bit cells. For example, the memory device may sample the current state of each bit cell by performing a referenced read operation and/or by applying a voltage to each of the bits cells and determining an associated resistance.

Once the state of each bit to be written to the memory array 304 and the current state of the each bit cell within the memory array 304(A) is identified, the memory device may identify a first set of bits, generally indicated by 330 and illustrated by a horizontal shading in the memory array 304(B), to be written to a high resistive state. Similarly, the memory device may identify a second set of bits, generally indicated by 332 and illustrated by a vertical shading in the memory array 304(B), to be written to a low resistive state. For example, the memory device may identify the first set of data bits 330 and the second set of data bits 332 by comparing the current state of the bit cells of memory array 304(A) to the state of the bits of the data 302.

In the illustrated example, the memory device may be configured to apply a first up voltage 314 to switch at least a portion of the first set of bit cells 330 to the high resistive state. For example, the first up voltage 314 may have a predetermined magnitude and/or be applied for a predetermined duration. In some examples, the predetermined magnitude of the first up voltage 314 may be set at a voltage level estimated to switch the state of less than one hundred percent of the bit cells. For example, the magnitude may be set to a voltage level estimated to switch the state associated with about twenty five percent of the bit cells, fifty percent of the bit cells, seventy five percent of the bit cells, eighty percent of the bit cells, ninety percent of the bit cells, etc. Likewise, the predetermined duration of the first up voltage 314 may be set at a period of time estimated to switch the state of less than one hundred present of the bit cells. For example, the predetermined duration may be set to a length estimated to switch the state associated with about twenty five percent of the bit cells, fifty percent of the bit cells, seventy five percent of the bit cells, eighty percent of the bit cells, ninety percent of the bit cells, etc.

Once the first up voltage 314 is applied to the first set of bit cells 330, the memory device may perform the first evaluate operations 316 to determine a state of the bits cells associated with the first set of bit cells 330. From the first set of bit cells 330, the memory device may identify a first subset of bit cells, generally indicated by 334 and illustrated by the darkened horizontal shading in the memory array 304(D). In general, the first subset of bit cells 334 are bit cells of the first set of bit cells 330 that remained in the low resistive state after the first up voltage 314 was applied (e.g., bit cells that failed to switch from the low resistive state to the high resistive state).

Once the bit cells of the first subset 334 are identified, the memory device may apply the second up voltage 318 to switch the bit cells of the first subset 334 from the low resistive state to the high resistive state. For example, the second up voltage 318 may have a larger magnitude and/or be applied for a longer duration than the first up voltage 314 to ensure the remaining bit cells of the first subset 330 are set to the high resistive state. Thus, as described above, the MTJs having a higher natural resistance may be switched by the first up voltage 314 reducing the risk and speed at which at least some of the tunnel junctions are broken down or shorted. The second up voltage 318 may then be applied to ensure the MTJs having a lower natural resistance are set or switched to the high resistive state and the data 302 is stored correctly.

In the illustrated example, the memory device may be configured to apply the first down voltage 320 to switch at least a portion of the second set of bit cells 332 to the low resistive state. For example, similar to the first up voltage 314, the first down voltage 320 may have a predetermined magnitude and/or be applied for a predetermined duration. In some examples, the predetermined magnitude of the first down voltage 320 may be set at a voltage level estimated to switch the state of less than one hundred present of the bit cells. For example, the magnitude of the first down voltage 320 may be set to a level estimated to switch the state associated with about twenty five percent of the bit cells, fifty percent of the bit cells, seventy five percent of the bit cells, eighty percent of the bit cells, ninety percent of the bit cells, etc. Likewise, the predetermined duration of the first down voltage 320 may be set at a period of time estimated to switch the state of less than one hundred present of the bit cells. For example, the duration of the first down voltage 320 may be set to a length estimated to switch the state associated with about twenty five percent of the bit cells, fifty percent of the bit cells, seventy five percent of the bit cells, eighty percent of the bit cells, ninety percent of the bit cells, etc.

Once the first down voltage 320 is applied to the second set of bit cells 332, the memory device may perform second evaluate operations 322 to determine a state of the bits cells associated with the second set of bit cells 332. From the second set of bit cells 332, the memory device may identify a second subset of bit cells, generally indicated by 336 and illustrated by the darkened vertical shading in the memory array 304(F). In general, the second subset of bit cells 336 are bit cells of the second set of bit cells 332 that remained in the high resistive state after the first down voltage 320 was applied (e.g., bit cells that failed to switch from the high resistive state to the low resistive state).

Once the bit cells of the second subset 336 are identified, the memory device may apply the second down voltage 324 to switch the remaining bit cells of the second subset 336 from the low resistive state to the high resistive state. For example, the second down voltage 324 may have a larger magnitude and/or be applied for a longer duration than the first down voltage 320 to ensure the remaining bit cells of the second subset 336 are set to the low resistive state. Thus, the MTJs having a higher natural resistance may be switched by the first down voltage 320 reducing the risk and speed at which at least some of the tunnel junctions are broken down or shorted. The second down voltage 324 may then be applied to the second set of bit cells 332 to ensure the MTJs having a lower natural resistance are set or switched to the low resistive state and the data 302 is stored correctly, as shown in the memory array 304(H).

Figure 4:
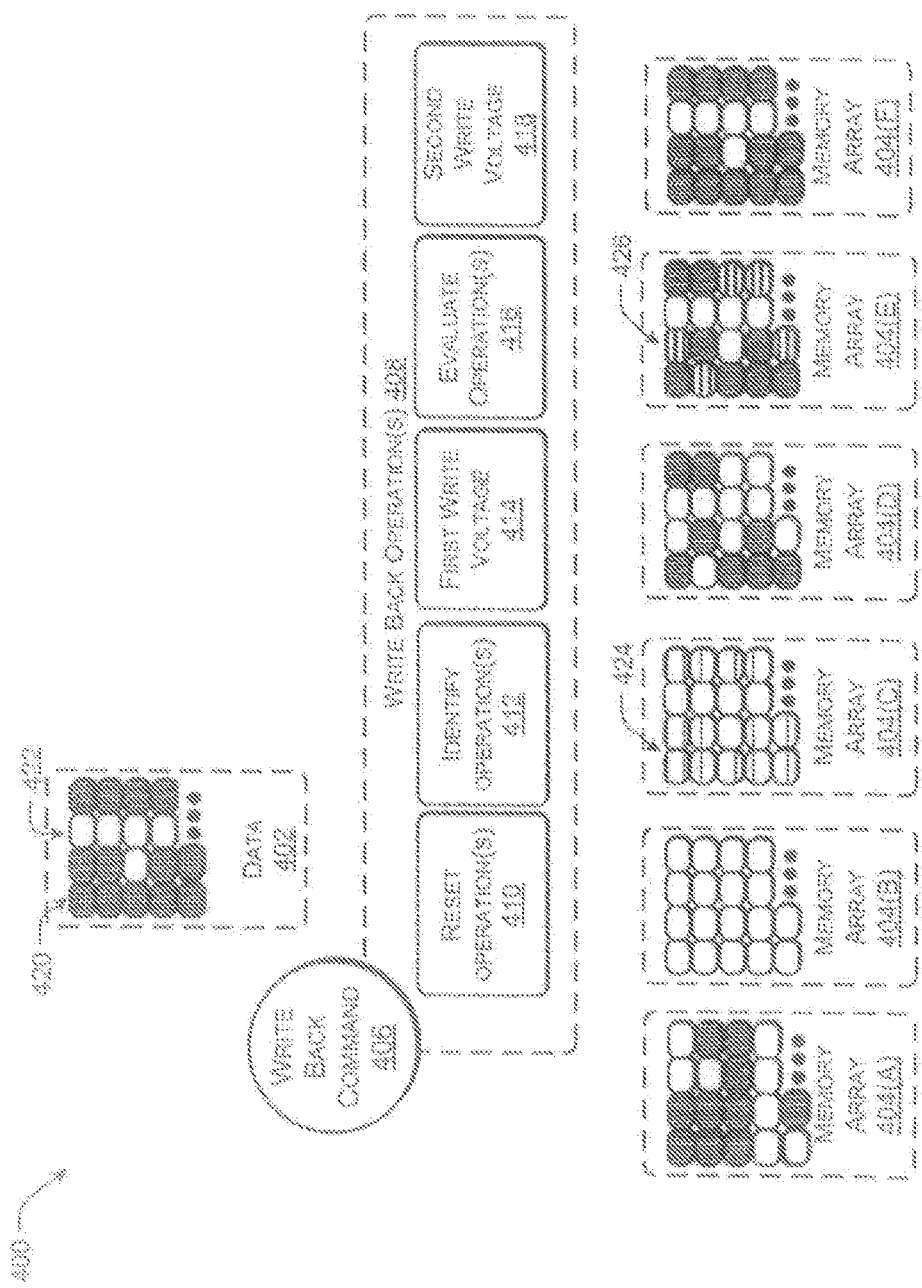
FIG. 4 illustrates another example diagram associated with writing data into bit cells of a memory array according to some implementations.

FIG. 4 illustrates another example diagram associated with writing data 402 into bit cells of a memory array 404 according to some implementations. In some cases, it may be desirable, for instance, from a power perspective, to reset each of the bits of the memory array 404 to a predetermined state prior to writing the data 402 into the bit cells. For example, the memory device may implement an inversion scheme that benefits from having each bit cell of the memory array 404 in a predetermined state prior to writing data back into the memory array 404. For example, some inversion schemes include a process of setting each of the bit cells to the low resistive state prior to writing the 402 data into the array 404. The memory device may then perform a majority detection with regard to the state of the data 402 to identify the majority state and the minority state associated with the data bits. In this scheme, the memory device may then store the data 402 in the memory array 404 such that the bit cells corresponding to the data bits in the minority state are switched from the low resistive state to the high resistive state. For example, if the minority state is the low resistive state, the data 402 is stored and one or more inversion bits are not set. However, if the minority state is the high resistive state, the data 402 is inverted before storing and the one or more inversion bits are set. In this manner, the memory device may save power by setting fewer of the bits to the high resistive state following each write back command 406.

In these cases, the memory device may receive a write back command 406 (or in some implementations a precharge command) from the external source to cause the memory device to perform write back operations 408 and to write the data 402 stored in a cache into the bit cells of the memory array 404. In the illustrated example, the data bits of the data 402 and the bit cells of the memory array 404 are shown as either light or dark. In this example, assume that a darkened bit is representative of a high resistive state or a value of one and a light bit is representative of a low resistive state or a value of zero. In general, the bit cells of the memory array 404 are shown at various points in time, as the write operations 408 are performed by the memory device. For example, memory array 404(A) illustrates the state of the bit cells prior to receiving the write back command 406. Memory array 404(B) illustrates the state of the bit cells following the completion of the reset operations 410. Memory array 404(C) illustrates the state of the bit cells following the completion of the identify operations 412. Memory array 404(D) illustrates the state of the bit cells following the application of the first write voltage 414. Memory array 404(E) illustrates the state of the bit cells following the completions of the evaluate operations 416. Memory array 404(F) illustrates the state of the bit cells following the application of the second write voltage 418.

As part of the write operations 408, the memory device may perform the reset operations 410 on the bit cells of the memory array 404(A) to cause each of the bit cells to be reset to a predetermined resistive state. In the illustrated example, each of the bit cells of the memory array 404(A) are set to the low resistive state (represented in the illustrated example by the light colored data bits and bit cells), as shown in memory array 404(B) and with respect to data 402. However, in other examples, the reset operations 410 may cause each of the bit cells to be set to a high resistive state.

The memory device also performs identify operations 412 to identify a state associated with each data bit of the data 402. For instance, with regard to the illustrated example, a first portion of the bits, generally indicated by 420, of the data 402 are dark and, therefore, representative of a value of one or a high resistive state. Similarly, a second portion of the bits, generally indicated by 422, of the data 402 are light and, therefore, representative of a value of zero or a low resistive state. In this example, since the reset operations 410 were performed on the bit cells of the memory array 404(A), the memory device may switch just the bit cells that correspond to the data bits having a value of one or representative of a high state. Therefore, the memory device of the illustrated example may further improve power consumption associated with the memory device describe above with respect to FIGS. 2 and 3, as only an up voltage may be applied.

In the illustrated example, the memory device first performs the reset operations 410 and then performs the identify operations 412, however, in other examples, the memory device may performs the identify operations 412 followed by the reset operations 410. Once the memory device has reset the bit cells of the memory array 404(A) and has identified the state or value associated with the data bits of the data 402, the memory device may identify a set of data bits, generally indicated by 424 and illustrated as a horizontal shading in the memory array 404(D), to be switched to the high resistive state.

To switch the set of data bits 424, the memory device may apply the first write voltage 414 across the tunnel junctions of the bit cells of the set of bits 424 to set at least a portion of the bit cells of the set of bits 424 to the high resistive state. In some implementations, applying the first write voltage 414 may include applying a voltage having a first predetermined magnitude across the tunnel junctions of the bit cells. In other implementations, applying the first write voltage 414 may include applying a voltage for a first predetermined duration across the tunnel junctions of the bit cells. In other implementations, applying the first write voltage 414 may include applying a voltage having both the first predetermined magnitude and for first predetermined duration across the tunnel junctions of the bit cells. In some examples, the first predetermined magnitude of the first voltage may be set at a voltage level estimated to switch the state of less than one hundred percent of the bit cells. Similarly, the first predetermined duration of the first voltage may be set at a period of time estimated to switch the state of less than one hundred present of the bit cells.

After applying the first write voltage 414, the memory device may perform the evaluate operations 416 to identify a subset of bit cells, generally indicated by 426 and illustrated with a darkened horizontal shading in the memory array 404(E), remaining in the low resistive state. In general, the subset of bit cells 426 are bit cells of the set of bit cells 424 that the first write voltage 414 did not cause to switch from the low resistive state to the high resistive state. In some instances, the memory device may perform the evaluate operations 416 on each of the bit cells of the memory array, while in other instances the memory device may perform the evaluate operations 416 on only the bit cells of the set of bit cells 424.

In some examples, the subset of bit cells 426 may exist since the first predetermined magnitude and/or the first predetermined duration of the first write voltage 414 may be configured such that a state of at least some portion of the bit cells of the memory array 404 do not switch states. Thus, it is possible that one or more bit cells of the set of bit cells 424 did not switch to the high resistive state upon the memory device applying the first write voltage 414, as illustrated in memory array 404(E). For instance, in the illustrated example five bit cells failed to switch to the high resistive state following the application of the first write voltage 414. Thus, the memory device may evaluate the bit cells associated with the set of bit cells 424 to identify that the five bits of the subset 426 remained in the low resistive state. In some examples, the number of bit cells in the subset 426 may depend on the particular magnitude and/or duration selected for the first write voltage 414, as well as properties of the particular bit cells of the memory array 404 being written.

If at least one bit cell remained in the low resistive state, the memory device may apply a second write voltage 418 across the tunnel junctions associated with the bit cells of the subset 426. The second write voltage 418 may have a second predetermined magnitude, be applied for a second predetermined duration, and/or both. In some cases, the second predetermined magnitude may be a larger than the first predetermined magnitude associated with the first write voltage 414 and the second predetermined duration may be longer than the first predetermined duration associated with the first write voltage 414. For example, the second predetermined magnitude may be set to a voltage level estimated to switch the state of each of the bit cells of the memory array and the second predetermined duration may be set to a period of time sufficient to switch the state of each of the bit cells of the memory array.

In some particular cases, the second write voltage 418 may be configured such that the combination of the second predetermined magnitude and the second predetermined duration is sufficient to switch the state of each of the bit cells of the memory array 404. Thus, the second write voltage 418 having a larger magnitude and/or a longer duration ensures that the bit cells of the subset 426 (e.g., the bit cells whose state was not switched in response to first write voltage 414) are set to the high resistive state. For example, in the illustrated example, following the application of the second write voltage 418, the bit cells of the memory array 404(F) are placed in a state corresponding to the state of the bits of the data 402 being written.

By applying a first write voltage 414 and a second write voltage 418 in the manner describe above, the second write voltage 418 having a larger magnitude and/or duration may be applied to a smaller portion or number of the bit cells than if only the second write voltage 418 was applied. In this manner, the memory device is able to experience reduced power consumption, as lower voltages applied for a shorter period are used to switch the state of at least a portion of the bit cells. Likewise, the memory device may experience improved reliability, as less voltage is applied across the tunnel junction of at least a portion of the bit cells slowing a rate associated with the dielectric break down of the MTJs.

Figure 5:
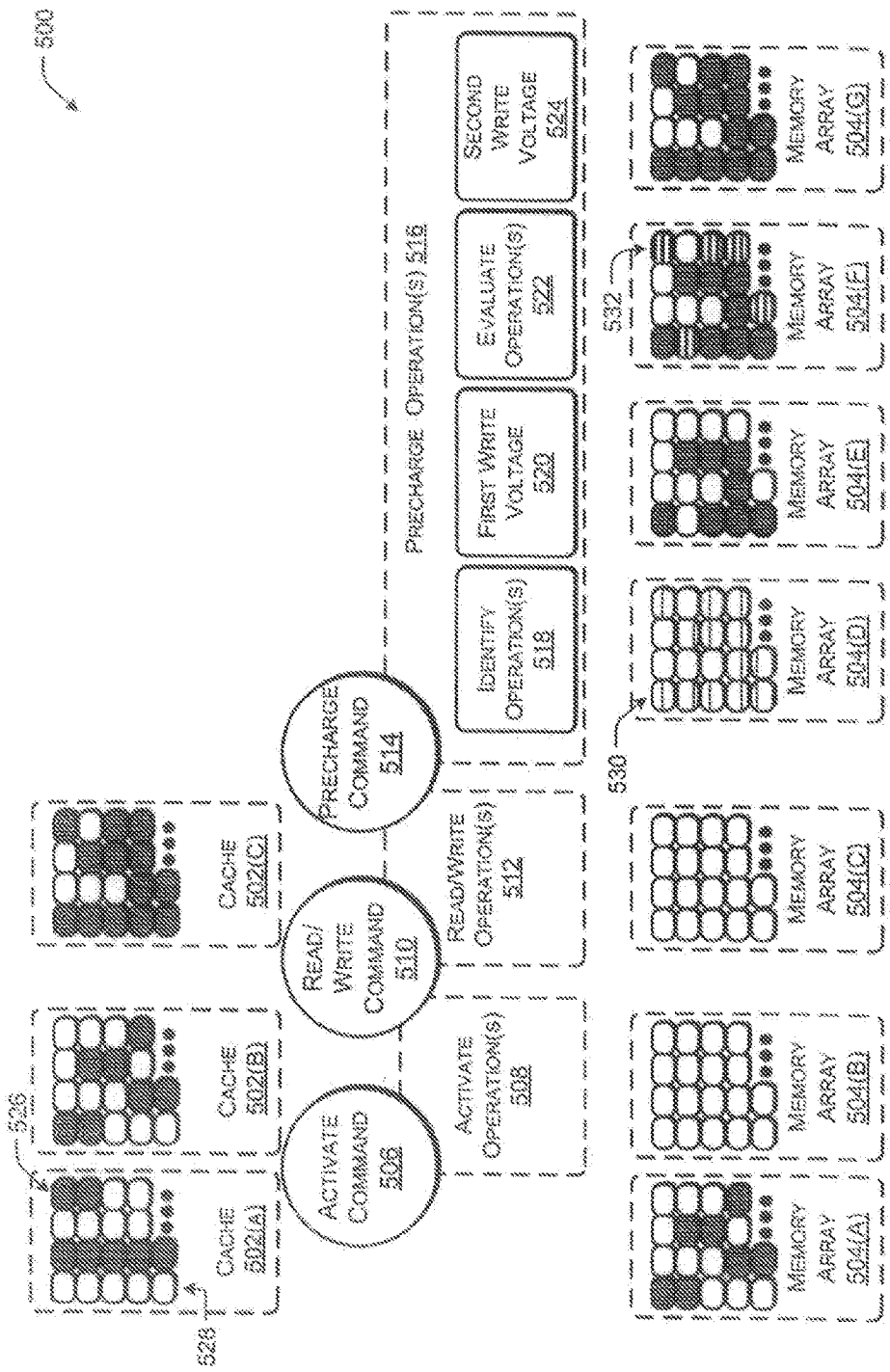
FIG. 5 illustrates an example diagram associated with writing cache bits of a cache into bit cells of a memory array as part of activate-read/write-precharge sequence according to some implementations

FIG. 5 illustrates another example diagram associated with writing cache bits of a cache 502 into bit cells of a memory array 504 as part of precharge operations according to some implementations. For example, some memory devices may be configured to respond to commands from an external source accessing the memory arrays of the memory device by issuing a predetermined series or sequence of commands. For instance, the external source may be configured to issue commands according to an activate-read/write-precharge sequence. In general, an activate command 506 may be issued by the external source to cause the memory device to perform activate operations 508 associated with opening a page by, for instance, loading state information from the bit cells of the memory array 504 into the cache 502. The read/write commands 510 may be issued by the external source to cause the memory device to perform read/write operations 512 associated with editing and/or accessing the cache 502 while the data is stored in the cache 502. The precharge command 514 may be issued by the external source to cause the memory device to perform precharge operations 516 associated with closing the open page by, for instance, writing the data stored in a cache 502 into the bit cells of a memory array 504.

In general, the cache bits of the cache 502 and the bit cells of the memory array 504 are shown at various points in time, as the activate command 506, read/write command 510, and the precharge command 514 are received and the activate operations 508, read/write operations 512, and the precharge operations 516 are performed by the memory device. For instance, in the illustrated example, the cache 502 is shown at a first time as cache 502(A), a second time as cache 502(B), and a third time as cache 502(C). For example, the cache 502(A) shows the cache bits prior to the memory device receiving the activate command 506, the cache 502(B) shows the cache bits after the activate operations 508 are performed and the data in the memory array 504 has been loaded into the cache, and the cache 502(C) shows the cache bits after the read/write operations 512 have altered the data in the cache 502. Similarly, the memory array 504 is illustrated at various points of time as memory array 504(A), memory array 504(B), memory array 504(C), memory array 504(D), memory array 504(E), memory array 504(F), and memory array 504(G). For instance, the memory array 504(A) illustrates the state of the bit cells prior to receiving the activate command 506, the memory array 504(B) illustrates the state of the bit cells following the completion of the activate operations 508, the memory array 504(C) illustrates the state of the bit cells following the completion of the read/write operations 512, the memory array 504(D) illustrates the bit cells following the completion of the identify operations 518, the memory array 508(E) illustrates the bit cells following the application of the first write voltage 520, memory array 504(F) illustrates the state of the bit cells following the completions of the evaluate operations 522, and memory array 504(G) illustrates the state of the bit cells following the application of the second write voltage 524.

In the illustrated example, the cache bits of the cache 502 and the bit cells of the memory array 504 are shown as either light or dark. In this example, assume that a darkened bit is representative of a high resistive state or a value of one and a light bit is representative of a low resistive state or a value of zero. For example, prior to reviving the activate command 508 the cache 502(A) has a portion of the bits, generally indicated by 526, that are darkened and, therefore, representative of a value of one or a high resistive state. Similarly, the cache 502(A) has a second portion of the bits, generally indicated by 528, that are light and, therefore, representative of a value of zero or a low resistive state.

In general, the memory device receives the activate command 506 and in response performs the activate operations 508 to load the content of the memory array 504(A) into the cache 502. In this illustrated example, the memory device is shown as implementing self-referenced reads. Thus, in this example, each of the bit cells of the memory array 504 may be set to the low resistive state as the data is read into the cache 502, as part of the activate operations 508. Thus, as illustrated, as the data is loaded from memory array 504(A)

into the cache 502(B), the bit cells of the memory array 504 are reset (or placed in the low resistive state), as illustrated by memory array 504(B).

Once a time period associated the with the activate operations 508 has expired, the memory device may receive one or more read/write commands 510 form an external source that causes the memory device to perform read/write operations 512 associated with accessing or editing the data stored in the cache 502. For instance, in the illustrated example, the cache 502(C) is shown after the completion of at least one write operation, as the data in the cache 502(C) differs from the data in the cache 502(B).

Following the expiration of a time period associated with the read/write operations 512, the memory device receives the precharge command 514 to cause the memory device to perform the precharge operations 516 to write the data in the cache 502(C) back into the memory array 504. As part of the precharge operations 514, the memory device may first perform the identify operations 518 on the cache bits of the cache 502(C) to determine a state associated with each of the cache bits and, thereby, determines a set of bit cells, generally indicated by 530 and illustrated by the horizontal shading in the memory array 504(D). In general, the set of bit cells 530 are bit cells of the memory array 504 that may be switched from the low resistive state to the high resistive state. For example, as discussed above the memory device may set each of the bit cells to the low resistive state following completion of the activate operations 508 and, therefore, only the bit cells being written to the high resistive state need be switched in the present example.

The memory device may apply the first write voltage 520 across the tunnel junctions of the bit cells of the set of bits 530 (e.g., the bit cells illustrated with the horizontal shading) to set at least a portion of the bit cells of the set of bits 530 to the high resistive state. As described above, applying the first write voltage 520 may include applying a voltage having a first predetermined magnitude for a first predetermined duration across the tunnel junctions of the bit cells.

The memory device may perform the evaluate operations 522 following the application of the first write voltage 520 to identify a subset of bit cells, generally indicated by 532 and illustrated with a darkened horizontal shading in the memory array 504(F). In general, the bit cells of the subset 532 are the bit cells of the set of bit cells 530 remaining in the low resistive state (e.g., bit cells of the set of bit cells 530 that the first write voltage 520 failed to set to the high resistive state). The memory device may apply the second write voltage 524 having a larger magnitude or a longer duration to the bit cells of the subset 532 to ensure that the bit cells of the subset 532 are switched into the high resistive state. In this manner, the memory device may utilize a first write voltage 520 having a reduced magnitude and/or duration in order to extend the lifetime of the device and/or to reduce power consumption and the second write voltage 524 having a larger magnitude and/or duration to ensure the data is stored correctly within memory array 504(G).

Figure 6:
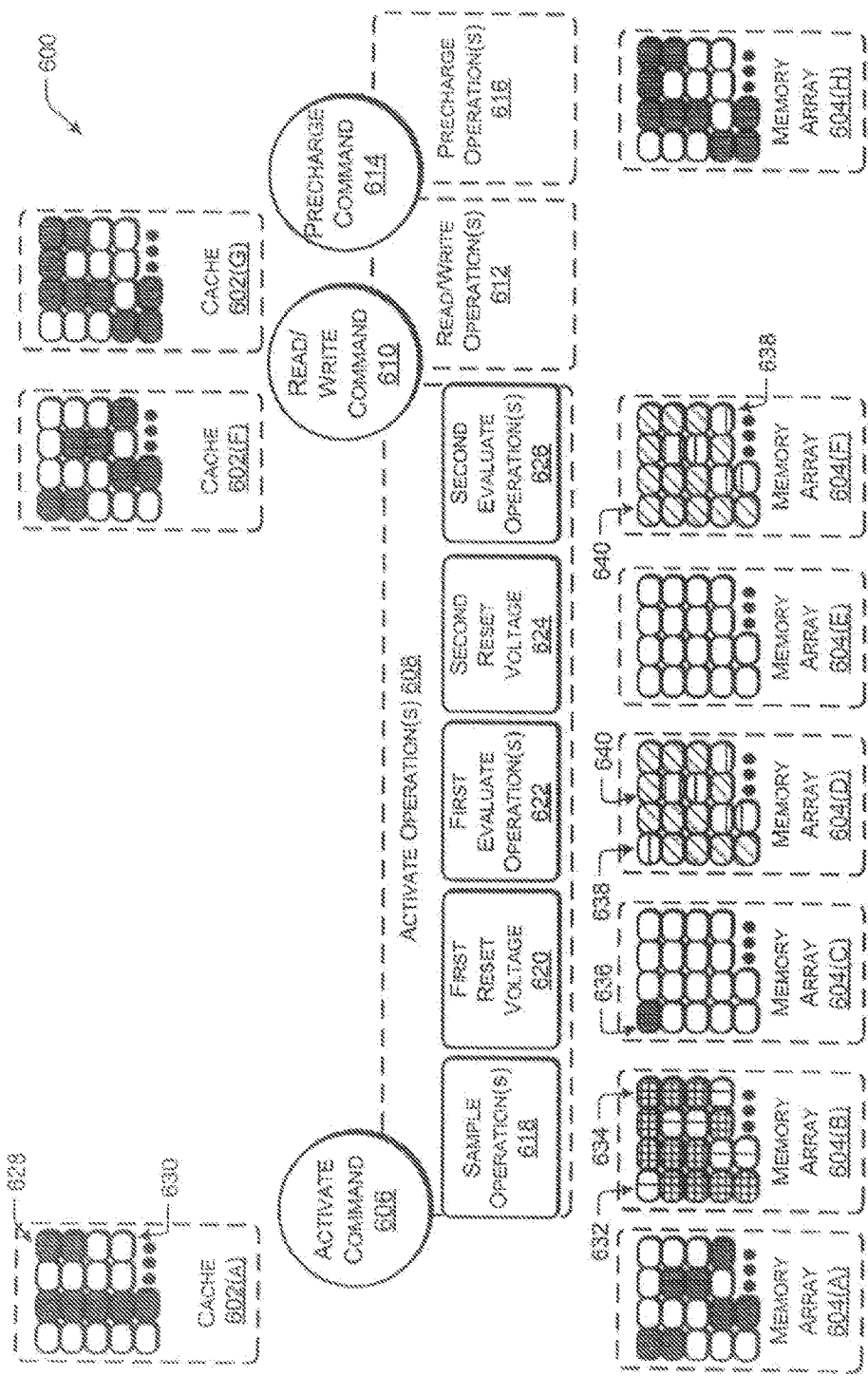
FIG. 6 illustrates another example diagram associated with writing cache bits of a cache into bit cells of a memory array as part of activate-read/write-precharge sequence according to some implementations.

FIG. 6 illustrates another example diagram associated with writing cache bits of a cache 602 into bit cells of a memory array 604 as part of an activate-read/write-precharge sequence according to some implementations. As described above with respect to FIG. 5, some memory devices may be configured to respond to commands from an external source accessing the memory arrays of the memory device by issuing a predetermined series or sequence of commands. For instance, the external source may be configured to issue commands according to an activate-read/write-precharge sequence. In general, an activate command 606 may be issued by the external source to cause the memory device to perform activate operations. The read/write commands 610 may be issued by the external source to cause the memory device to perform read/write operations 612. The precharge command 614 may be issued by the external source to cause the memory device to perform precharge operations 616.

In general, the cache bits of the cache 602 and the bit cells of the memory array 604 are shown at various points in time, as the activate command 606, read/write command 610, and the precharge command 614 are received and the activate operations 608, read/write operations 612, and the precharge operations 616 are performed by the memory device. For instance, in the illustrated example, the cache 602 is shown at a first time as cache 602(A), a second time as cache 602(F), and a third time as cache 602(G). For example, the cache 602(A) shows the cache bits prior to the memory device receiving the activate command 606, the cache 602(F) shows the cache bits after the activate operations 608 are performed, and the cache 602(G) shows the cache bits after the read/write operations 612 have altered the data in the cache 602.

Similarly, the memory array 604 is illustrated at various points of time as memory array 604(A), memory array 604(B), memory array 604(C), memory array 604(D), memory array 604(E), memory array 604(F), and memory array 604(H). For instance, the memory array 604(A) illustrates the state of the bit cells prior to receiving the activate command 606, the memory array 604(B) illustrates the bit cells following the completion of sample operations 618, the memory array 608(C) illustrate the bit cells following the application of the first reset voltage 620, the memory array 604(D) illustrates the state of the bit cells following the completion of evaluate operations 622, the memory array 504(E) illustrates the state of the bit cells following the application of the second reset voltage 624, the memory array 604(F) illustrates the state of the bit cells following the completion of evaluate operations 626, and the memory array 604(H) illustrates the state of the bit cells following the completion of the precharge operations 616.

In the illustrated example, the cache bits of the cache 602 and the bit cells of the memory array 604 are shown as either light or dark. In this example, assume that a darkened bit is representative of a high resistive state or a value of one and a light bit is representative of a low resistive state or a value of zero. For example, prior to receiving the activate command 608 the cache 602(A) has a portion of the bits, generally indicated by 628, that are darkened and, therefore, representative of a value of one or a high resistive state. Similarly, the cache 602(A) has a second portion of the bits, generally indicated by 630, that are light and, therefore, representative of a value of zero or a low resistive state.

In general, the memory device receives the activate command 606 and in response performs the activate operations 608 to load the content of the memory array 604(A) into the cache 602. In this illustrated example, the memory device is shown as implementing self-referenced reads. Thus, in this example, each of the bit cells of the memory array 604 may be set to the low resistive state as the data is read into the cache 602, as part of the activate operations 608. Thus, as illustrated, as the data is loaded from memory array 604(A) into the cache 602(F), the bit cells of the memory array 604 are reset (or placed in the low resistive state).

In the illustrated example, the activate command 606 is received from an external source. In response, the memory device first performs the sample operations 618 to identify a first current associated with each of the bit cells of the memory array 604. For example, as shown in memory array 604(B) the memory device determines a first set of bit cells, generally indicated by 632 and illustrated with vertical shading in memory array 604(B), having a first resistance when biased. The memory device also identifies a second set of bit cells, generally indicated by 634 and illustrated with crosshatch shading in memory array 604(B), having a second resistance when biased. The memory device then stores the state information (e.g., the measured current and resistance) associated with each of the bit cells.

Once the state information associated with the first set of bit cells 632 and the second set of bit cells 634 are stored, the memory device applies a first reset voltage to the bit cells of the memory array 604. In the illustrated example, the memory device applies a down voltage to set each of the bit cells to the low resistive state. However, in other implementations, the memory device may apply an up voltage to set each of the bit cells to the high resistive state. As illustrated, the first reset voltage 620 was of insufficient magnitude and/or duration to switch one of the bit cells, generally indicated by 636 and shown as the dark bit cells in memory array 604(C).

After applying the first reset voltage 620, the memory device performs the first evaluate operations 622 to identify which if any of the bit cells of the memory array 604 failed to switch states. For example, the memory device may identify the bit cells whose state changes by identifying a second current associated with each of the bit cells of the memory array after the first reset voltage 620 is applied and comparing the first current (e.g., the stored current) with the second current. If the state changed, then the first current and the second current will differ by more than a threshold amount, while if the state remained the same the first current and the second current will differ by less than the threshold amount. For instance, in the illustrated example, the memory device identified a third set of bit cells, generally indicated by 638 and illustrated by the diagonal shading in the memory array 604(D), as well as a fourth set of bit cells, generally indicated by 640 and illustrated by the horizontal shading in the memory array 604(D). In general, the third set of bit cells 638 are bit cells whose state did not change after the first reset voltage 620 was applied to the memory array 604 and the fourth set of bit cells 640 are bit cells whose state did change after the first reset voltage 620 was applied.

In general, since the first rest voltage 620 is configured with a magnitude and/or applied for a duration insufficient to reset one hundred percent of the bit cells of the memory array 604, the third set of bit cells 638 includes the bit cell 636 that remained in the high resistive state. Therefore, if the memory device, at this time, identified each bit cell of the third set of bit cells 636 as representing a high value, the memory device would cause an error with regards to bit cell 636 as the state did not change and the bit cell 636 would be read as a low resistive state and therefore output as a low value.

Therefore, the memory device is configured to apply the second reset voltage 624 to the third set of bit cells 638. The second reset voltage 624 is of sufficient magnitude and/or applied for a duration to reset the state of each bit cell of the memory array 604 to the low resistive state. By applying the second reset voltage 624 to only the third set of bit cells 638 as shown in the memory array 604(D), the voltage having larger magnitude and/or duration is applied to only a subset of the bit cells of the memory array 604 and therefore, the lifetime of the memory array 604 may be extended and the overall power consumption of the memory device may be reduced.

Following the application of the second reset voltage 624, all of the bit cells of the memory array 604 are reset to the low resistive state, as shown by the memory array 604(E), including the bit cell 636 that failed to switch to the low resistive state after the first reset voltage 620 was applied. The memory device may then perform the second evaluate operations 626 to update the third set of bit cells 638 and the fourth set of bit cells 640. For instance, during the second evaluate operations 626, the memory device may identify a third current associated with each of the bit cells of the third set of bit cells 638 (e.g., the bit cells that did not change state after the first rest voltage 630 was applied) and compare the third current with the first current for each of the bit cells of the third set of bit cells 638. In this manner, the memory device may identify that bit cell 638 did experience a state change and should be included in the fourth set of bit cells 640 (representative of high values) rather than as part of the third set of bit cells 638 (representative of low values). Thus, as illustrated with respect to memory array 604(E), the bit cell 636 is included in the fourth set of bit cells 640.

Once the third set of bit cells 638 and the fourth set of bit cells 640 are correctly identified, the memory device may read the data into the cache 602(F) and receive one or more read/write commands 610. The memory device may then perform the read/write operations 612 to allow the external source to access or edit the data stored in the cache 602, illustrated by the cache 602(G).

To complete the page access the memory device receives the precharge command 614 and in response performs the precharge operations 616 to write the data stored in the cache 603(F) back into the memory array 604 and illustrated as the memory array 604(H), as described above with respect to FIG. 5.

While FIGS. 1-6 illustrate timing diagrams associated with accessing data stored in a memory array according to some implementations, FIGS. 7-12 illustrate example processes performed by a memory device implementing the sequences described above. The processes are illustrated as a collection of blocks in a logical flow diagram, which represents a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks may be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Figure 7:
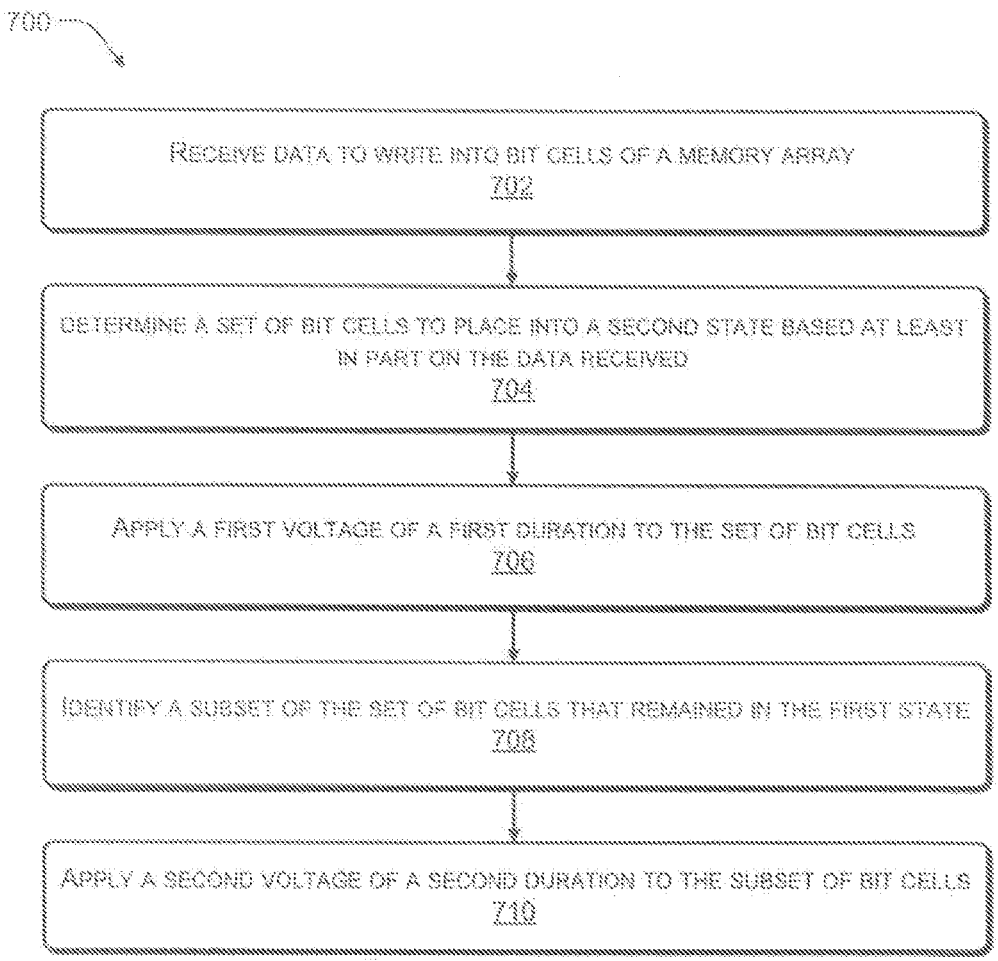
FIG. 7 illustrates an example flow diagram showing an illustrative process associated with storing data in a memory array according to some implementations.

FIG. 7 illustrates an example flow diagram showing an illustrative process 700 associated with storing data in one or more memory arrays according to some implementations. At 702, a memory device receives data to write into bit cells of one or more memory arrays. For example, the memory device may receive a write back command as described with respect to FIGS. 1-4 and/or a precharge command as describe above with respect to FIGS. 5 and 6. In response, the memory device may access the data via one or more cache bits. In some example, the memory device may receive a stream of data, for instance, from an external source.

At 704, the memory device determines a set of data bits to place into a second state based at least in part on the data received. For example, the memory device may have reset each of the bit cells to a first state and identify the set of bit cells by identifying bit cells that correspond to data to be stored in the second state.

At 706, the memory device applies a first voltage for a first duration to the set of bit cells. In some cases, the first duration may be relatively short and/or of insufficient length to switch one hundred percent of the bit cells of the memory arrays to the second state. For example, the first duration may be less than a first threshold duration. In some cases, the first threshold duration may be a duration or length of time estimated to switch the state of about eighty five percent of the bit cells, ninety percent of the bit cells, ninety five percent of the bit cells, ninety nine percent of the bit cells, ninety nine point nine percent of the bit cells, etc.

At 708, the memory device identifies a subset of the set of bit cells. The bit cells within the subset of bit cells include bit cells that remained in the first state following the application of the first voltage. For instance, in one example, the memory device may be configured to evaluate the state of the set of bit cells using a referenced read operation. In another example, the memory device may be configured to sample and store a current associated with each of the bit cells prior to the application of the first voltage. The memory device may then evaluate the state by comparing the stored current to current associated with each bit cell of the set of bit cells following the application of the first voltage.

At 710, the memory device applies a second voltage for a second duration to the subset of bit cells. In some cases, the second duration may be configured based in part on the first duration. For instance, the second duration may be configured to be longer than the first duration. For example, the second duration may be greater than the first threshold duration. In other cases, the second duration may be greater than a second threshold duration. For instance, the second threshold duration may be a duration of sufficient length to switch or set one hundred percent of the bit cells of the memory arrays within the memory device. In this manner, the memory device is able to apply a voltage having a shorter duration to at least some of the bit cells, while ensuring the data is stored correctly by selectively applying a voltage for a longer duration.

Figure 8:
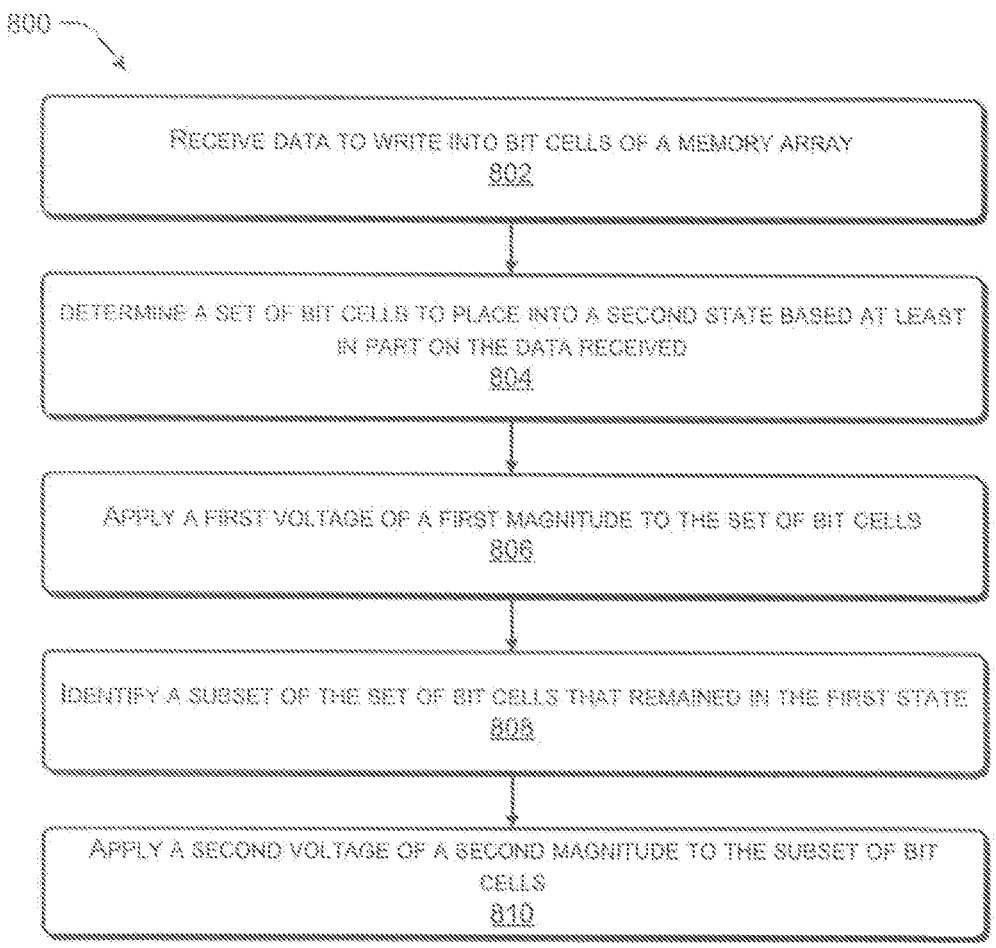
FIG. 8 illustrates another example flow diagram showing an illustrative process associated with storing data in one or more memory arrays according to some implementations.

FIG. 8 illustrates another example flow diagram showing an illustrative process 800 associated with storing data in one or more memory arrays according to some implementations. At 802, a memory device receives data to write into bit cells of one or more memory arrays. For example, the memory device may receive a write back command as described with respect to FIGS. 1-4 and/or a precharge command as described above with respect to FIGS. 5 and 6. In response, the memory device may access the data via one or more cache bits. In some examples, the memory device may receive a stream of data, for instance, from an external source.

At 804, the memory device determines a set of data bits to place into a second state based at least in part on the data received. For example, the memory device may have reset each of the bit cells to a first state and identify the set of bit cells by identifying bit cells that correspond to data to be stored in the second state.

At 806, the memory device applies a first voltage of a first magnitude to the set of bit cells. In some cases, the first magnitude may be relatively small and/or of insufficient strength to switch one hundred percent of the bit cells of the memory arrays to the second state. For example, the first magnitude may be less than a first threshold magnitude. In some cases, the first threshold magnitude may be set at a magnitude estimated to switch the state of about twenty five percent of the bit cells, fifty percent of the bit cells, seventy five percent of the bit cells, eighty percent of the bit cells, ninety percent of the bit cells, etc.

At 808, the memory device identifies a subset of the set of bit cells. The bit cells within the subset of bit cells include bit cells that remained in the first state following the application of the first voltage. For instance, in one example, the memory device may be configured to evaluate the state of the set of bit cells using a referenced read operation. In another example, the memory device may be configured to sample and store a current associated with each of the bit cells prior to the application of the first voltage. The memory device may then evaluate the state by comparing the stored current to current associated with each bit cell of the set of bit cells following the application of the first voltage.

At 810, the memory device applies a second voltage having a second magnitude to the subset of bit cells. In some cases, the second magnitude may be configured based in part on the first magnitude. For instance, the second magnitude may be configured to be larger than the first magnitude. For example, the second magnitude may be greater than the first threshold magnitude. In other cases, the second magnitude may be greater than a second threshold magnitude. For instance, the second threshold magnitude may be set to a level sufficient to switch or set one hundred percent of the bit cells of the memory arrays within the memory device. In this manner, the memory device is able to apply a voltage having a lower magnitude to at least some of the bit cells, while ensuring the data is stored correctly by selectively applying a voltage having a larger magnitude.

Figure 9:
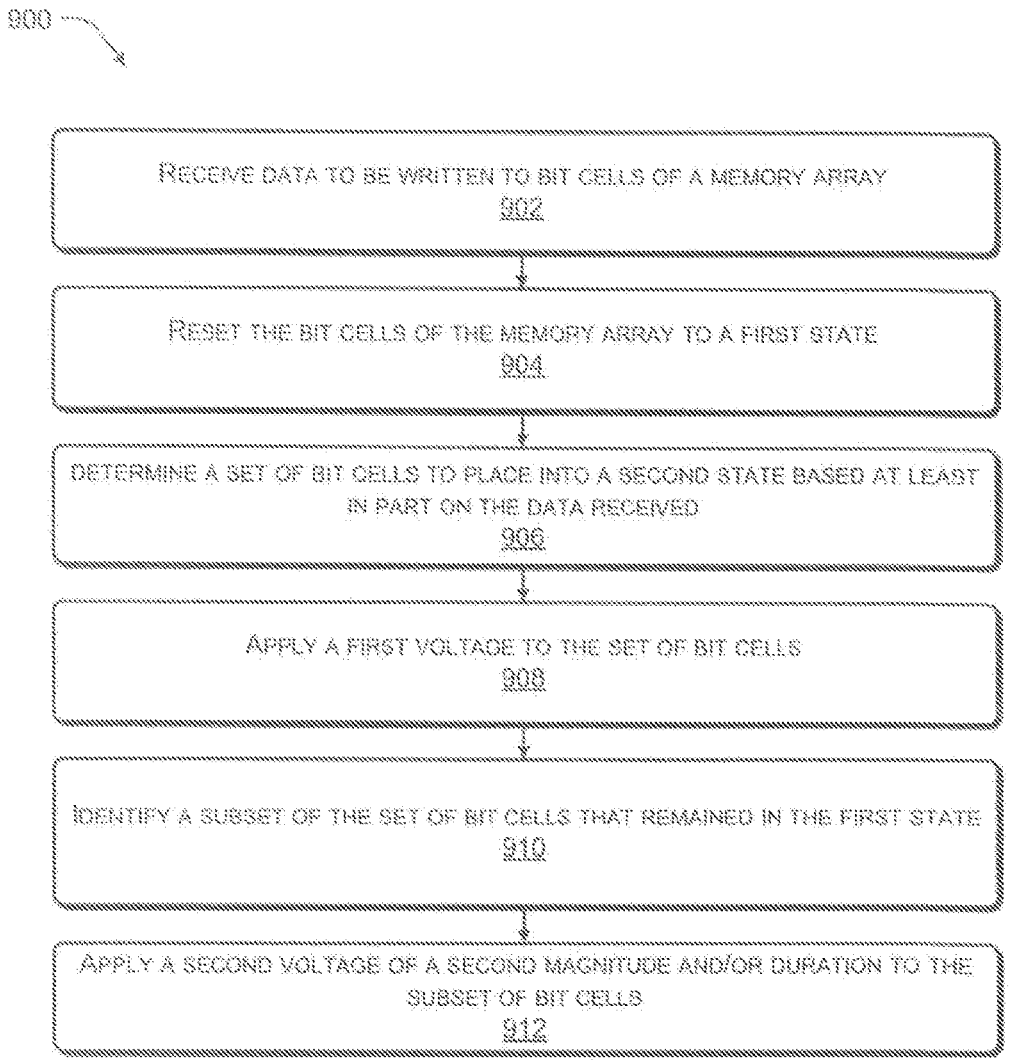
FIG. 9 illustrates another example flow diagram showing an illustrative process associated with storing data in one or more memory arrays according to some implementations.

FIG. 9 illustrates another example flow diagram showing an illustrative process 900 associated with storing data in one or more memory arrays according to some implementations. At 902, a memory device receives data to write into bit cells of one or more memory arrays. For example, the memory device may receive a write back command as described with respect to FIGS. 1-4 and/or a precharge command as described above with respect to FIGS. 5 and 6. In response, the memory device may access the data via one or more cache bits. In some examples, the memory device may receive a stream of data, for instance, from an external source.

At 904, the memory device resets the bit cells of the memory arrays to a first state. For example, the memory device may implement an inversion scheme that benefits from having each bit cell of the memory arrays in a predetermined state prior to storing data. For example, some inversion schemes include a process of setting each of the bit cells to the low resistive state prior to storing the data into the arrays. The memory device may then perform a majority detection with regards to the state of the data to identify the majority state and the minority state associated with the data bits. In this scheme, the memory device may store the data in the memory arrays such that the bit cells corresponding to the data bits in the minority state are switched from the low resistive state to the high resistive state. For example, if the minority state is the low resistive state, the data is stored and one or more inversion bits are not set. However, if the minority state is the high resistive state, the data is inverted before storing and the one or more inversion bit are set. In this manner, the memory device may save power by setting a fewer of the bits to the high resistive state.

At 906, the memory device determines a set of data bits to place into a second state based at least in part on the data received. For example, following resetting the bit cells to the first state, the memory device may form the set of bit cells by identifying bit cells that correspond to data to be stored in the second state.

At 908, the memory device applies a first voltage to the set of bit cells. In some cases, the first voltage may have a first duration that may be of insufficient length and/or a first magnitude that may be of insufficient strength to switch each of the bit cells of the memory arrays to the second state. In other cases, the combination of the first duration and the first magnitude may be insufficient to switch one hundred percent of the bit cells. For example, the first duration may be less than a first threshold duration and the first magnitude may be less than a first threshold magnitude. In some cases, the first threshold duration may be a duration or length of time estimated to switch the state of about eighty five percent of the bit cells, ninety percent of the bit cells, ninety five percent of the bit cells, ninety nine percent of the bit cells, ninety nine point nine percent of the bit cells, etc. Similarly, the first threshold magnitude may be set at a magnitude estimated to switch the state of about eighty five percent of the bit cells, ninety percent of the bit cells, ninety five percent of the bit cells, ninety nine percent of the bit cells, ninety nine point nine percent of the bit cells, etc.

At 910, the memory device identifies a subset of the set of bit cells. The bit cells within the subset of bit cells including bit cells that remained in the first state following the application of the first voltage. For instance, in one example, the memory device may be configured to evaluate the state of the set of bit cells using a referenced read operation. In another example, the memory device may be configured to sample and store a current associated with each of the bit cells prior to the application of the first voltage. The memory device may then evaluate the state by comparing the stored current to current associated with each bit cell of the set of bit cells following the application of the first voltage.

At 912, the memory device applies a second voltage to the subset of bit cells. In some cases, the second voltage has a second duration that may be configured based at least in part on the first duration and/or a second magnitude that may be configured based in part on the first magnitude. For instance, the second duration may be longer than the first duration and the second magnitude may be larger than the first magnitude. For example, the second duration may be longer than the first threshold duration the second magnitude may be greater than the first threshold magnitude. In other cases, the second duration may be longer than a second threshold duration and the second magnitude may be greater than a second threshold magnitude. For instance, the second threshold duration may be set to a length sufficient to switch or set one hundred percent of the bit cells and/or the second threshold magnitude may be set to a level sufficient to switch or set one hundred percent of the bit cells. In this manner, the memory device is able to apply a first voltage having a shorter duration, lower magnitude, or both to at least some of the bit cells, thereby extending the time period associated with the dielectric breakdown of the MTJs and extending the usable lifetime of the memory device.

Figure 10:
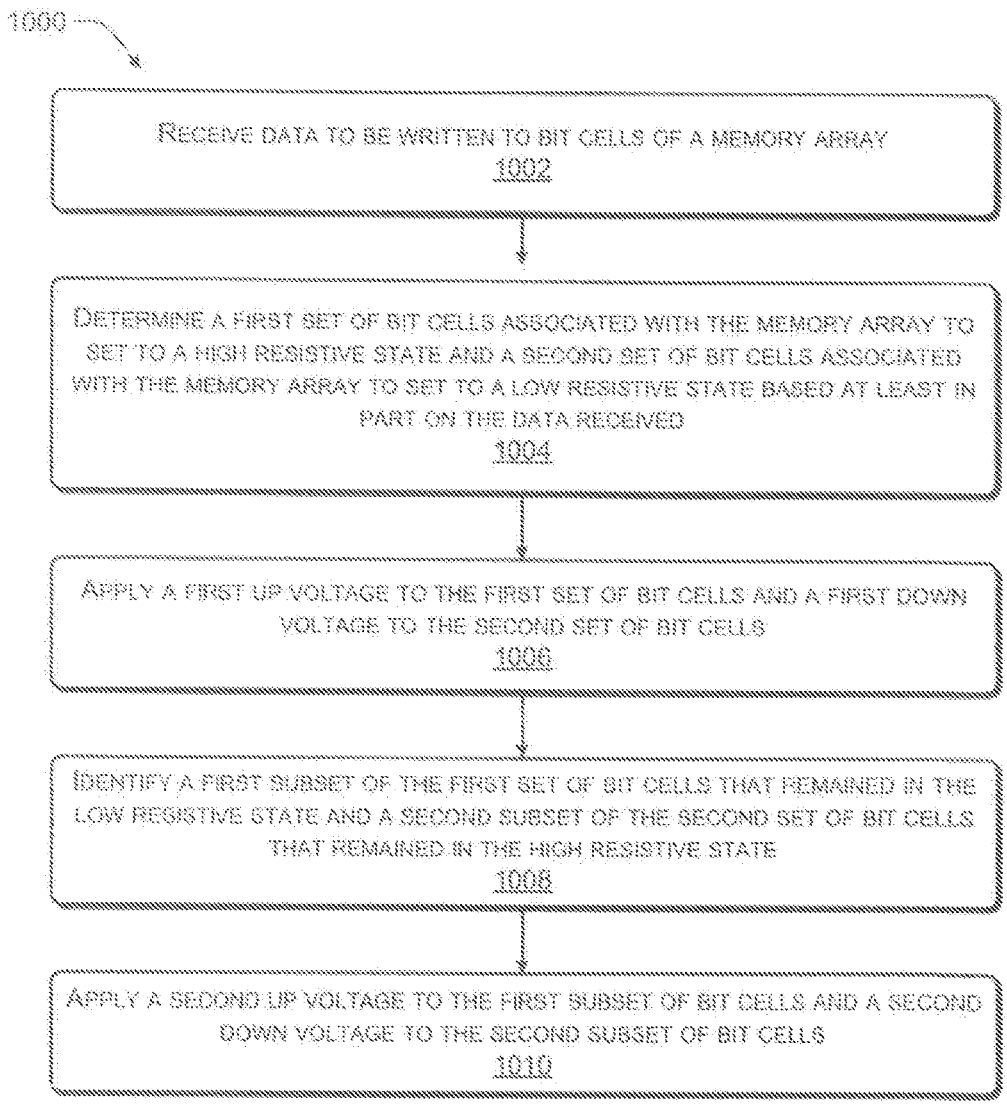
FIG. 10 illustrates another example flow diagram showing an illustrative process associated with storing data in one or more memory arrays according to some implementations.

FIG. 10 illustrates another example flow diagram showing an illustrative process 1000 associated with storing data in one or more memory arrays according to some implementations. At 1002, a memory device receives data to write into bit cells of one or more memory arrays. For example, the memory device may receive a write back command as described with respect to FIGS. 1-4 and/or a precharge command as described above with respect to FIGS. 5 and 6. In response, the memory device may access the data via one or more cache bits. In some examples, the memory device may receive a stream of data, for instance, from an external source.

At 1004, the memory device determines a first set of data bits to place into a first state and a second set of data bits to place into a second state based at least in part on the data received. For example, the memory device may sample a state associated with each of the bit cells being written to and compare the sampled state to the state of the data received. When the sampled state is compared to the data, the memory device may identify some bit cells that already in the correct state (e.g., bit cells in the low resistive state that correspond to low values in the data and bit cells in the high resistive state that correspond to high values). The memory device may also identify a set of bit cells that are in the high resistive state and correspond to low values in the data and a set of bit cells that are in the low resistive that correspond to high values in the data.

At 1006, the memory device applies a first up voltage to the first set of bit cells and a first down voltage to the second set of bit cells. In some cases, the first up voltage and the first down voltage may have a duration and/or magnitude to switch the state of a portion of the bit cells but fewer than one hundred percent of the bit cells, as described above.

At 1008, the memory device identifies a first subset of the first set of bit cells and a second subset of the second set of bit cells. The bit cells within the first subset of bit cells includes bit cells that remained in the low resistive state following the application of the first up voltage. The bit cells within the second subset of bit cells includes bit cells that remained in the high resistive state following the application of the first down voltage. For instance, in one example, the memory device may be configured to evaluate the state of the first set of bit cells and the second set of bit cells using a referenced read operation. In another example, the memory device may be configured to sample and store a current associated with each of the bit cells prior to the application of the first up voltage and the first down voltage. The memory device may then evaluate the state by comparing the stored current to current associated with each bit cell of the first set of bit cells and the second set of bit cells following the application of the first up voltage and the first down voltage.

At 1010, the memory device applies a second up voltage to the first subset of bit cells and a second down voltage to the second subset of bit cells. In some cases, the second up voltage has a duration and/or a magnitude greater than the duration and/or magnitude of the first up voltage. Similarly, the second down voltage may have a duration and/or a magnitude greater than the duration and/or magnitude of the first down voltage. For example, the duration and/or the magnitude of the second up voltage and the duration and/or the magnitude of the second down voltage may be configured to ensure that the bit cells of the memory arrays change states. In this manner, the memory device is able to apply a first up voltage and a first down voltage having a shorter duration, lower magnitude, or both to switch at least some of the bit cells, thereby extending the time period associated with the dielectric breakdown of the MTJs and extending the usable lifetime of the memory device.

Figure 11:
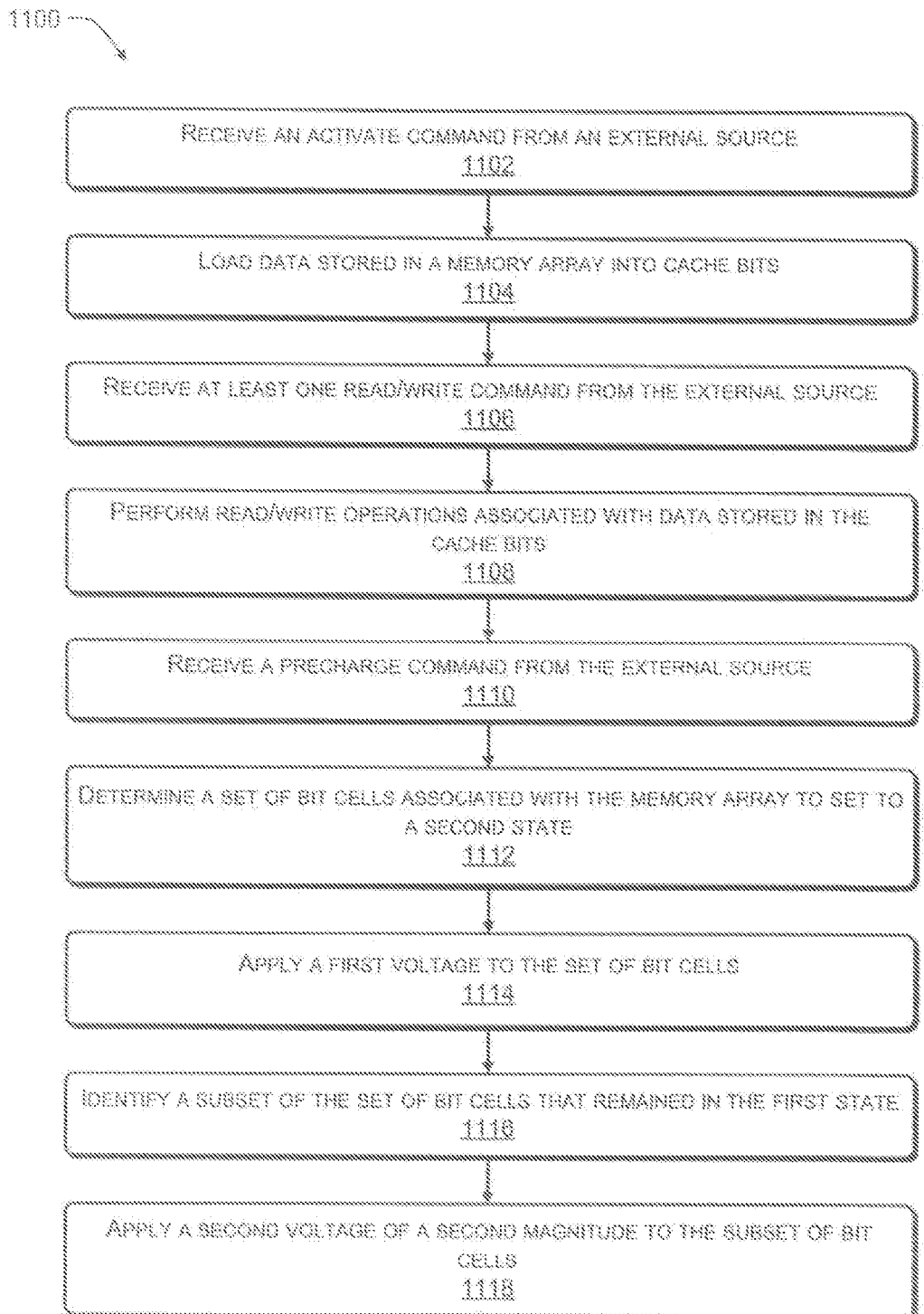
FIG. 11 illustrates another example flow diagram showing an illustrative process associated with storing data in one or more memory arrays according to some implementations.

FIG. 11 illustrates another example flow diagram showing an illustrative process 1100 associated with storing data in one or more memory arrays according to some implementations. For example a memory device may be configured to write cache bits into bit cells of a memory array according to a predetermined series or sequence of commands. In some particular implementations, the predetermined series or sequence of command may include an activate-read/write-precharge sequence.

At 1102, a memory device receives an activate command form the external source. For example, as discussed above with respect to FIG. 5, the activate command may cause the memory to perform activate operations associated with opening a page by, for instance, loading state information from the bit cells of the memory array into a cache.

At 1104, the memory device performs the activate operations and loads data stored in the memory array into cache bits. For example, the memory device may load the data as part of a reference read operation. In other examples, the memory device may be configured to perform self-referenced reads, as described above.

At 1106, the memory device receives at least one read/write command from the external source. For example, the read/write commands may be issued by the external source to cause the memory device to perform read/write operations associated with editing and/or accessing the cache while the data is stored in the cache. In some cases, the memory device may be configured to receive a single read or write command as part of the activate-read/write-precharge sequence of commands, for instance, when the memory device is configured to allow one access per page. In other cases, the memory device may be configured to receive multiple read and/or write commands associated with the data stored in the cache bits, for instance, the memory device may be configured to perform read/writes to the same page in series to improve performance.

At 1108, the memory device performs read/write operation associated with the data stored in the cache bits. For example, the memory device may be configured to allow the external source to access the data in the cache bits in response to a read command and to allow the external source to edit the data in the cache bits in response to a write command.

At 1110, the memory device receives a precharge command form the external source. For example, the precharge command may be issued by the external source to cause the memory device to perform precharge operations associated with closing the open page by, for instance, writing the data stored in cache bits into the memory array.

At 1112, the memory device determines a set of data bits to place into a second state. For example, the memory device may perform a reset operation as part of either the activate operations or the precharge operations to set each of the bit cells of the memory array to the first state. In one example, the memory device may perform self-referenced reads when loading the data into the cache and in this regards set each bit cell read to the first state. Thus, the memory device may form the set of bit cells by identifying bit cells that correspond to data to be stored in the second state (e.g., the bit cells that are in the opposite state of the corresponding cache bit).

At 1114, the memory device applies a first voltage to the set of bit cells. In some cases, the first voltage may have a first duration that may be of insufficient length and/or a first magnitude that may be of insufficient strength to switch each of the bit cells of the memory arrays to the second state. In other cases, the combination of the first duration and the first magnitude may be insufficient to switch one hundred percent of the bit cells. For example, the first duration may be less than a first threshold duration and the first magnitude may be less than a first magnitude threshold. In some cases, the first threshold duration may be a duration or length of time estimated to switch the state of about eighty five percent of the bit cells, ninety percent of the bit cells, ninety five percent of the bit cells, ninety nine percent of the bit cells, ninety nine point nine percent of the bit cells, etc. Similarly, the first threshold magnitude may be set at a magnitude estimated to switch the state of about eighty five percent of the bit cells, ninety percent of the bit cells, ninety five percent of the bit cells, ninety nine percent of the bit cells, ninety nine point nine percent of the bit cells, etc.

At 1116, the memory device identifies a subset of the set of bit cells. The bit cells within the subset of bit cells including bit cells that remained in the first state following the application of the first voltage. For instance, in one example, the memory device may be configured to evaluate the state of the set of bit cells using a referenced read operation. In another example, the memory device may be configured to sample and store a current associated with each of the bit cells prior to the application of the first voltage. The memory device may then evaluate the state by comparing the stored current to current associated with each bit cell of the set of bit cells following the application of the first voltage.

At 1118, the memory device applies a second voltage to the subset of bit cells. In some cases, the second voltage has a second duration that may be configured based at least in part on the first duration and/or a second magnitude that may be configured based in part on the first magnitude. For instance, the second duration may be longer than the first duration and the second magnitude may be larger than the first magnitude. For example, the second duration may be longer than the first threshold duration the second magnitude may be greater than the first threshold magnitude. In other cases, the second duration may be longer than a second threshold duration and the second magnitude may be greater than a second threshold magnitude. For instance, the second threshold duration may be set to a length sufficient to switch or set one hundred percent of the bit cells and/or the second threshold magnitude may be set to a level sufficient to switch or set one hundred percent of the bit cells. In this manner, the memory device is able to apply a first voltage having a shorter duration, lower magnitude, or both to at least some of the bit cells, thereby extending the time period associated with the dielectric breakdown of the MTJs and extending the usable lifetime of the memory device.

In the example of the process 1100, it is assumed the memory device reset the bit cells to the first state prior to writing the data in the cache bits back into the bit cells of the memory array. Thus, two voltages in a single direction were applied to the bit cells being placed in the second state. However, in other examples, the memory device may not reset the bit cells prior to writing the data from the cache bits into the array. In these examples, the memory device may perform additional operations to identify a second set of bit cells to place in the first state and apply two additional voltages in the opposite direction to switch the bit cells from the second state to the first state, as described above with respect to FIGS. 2 and 3.

Figure 12:
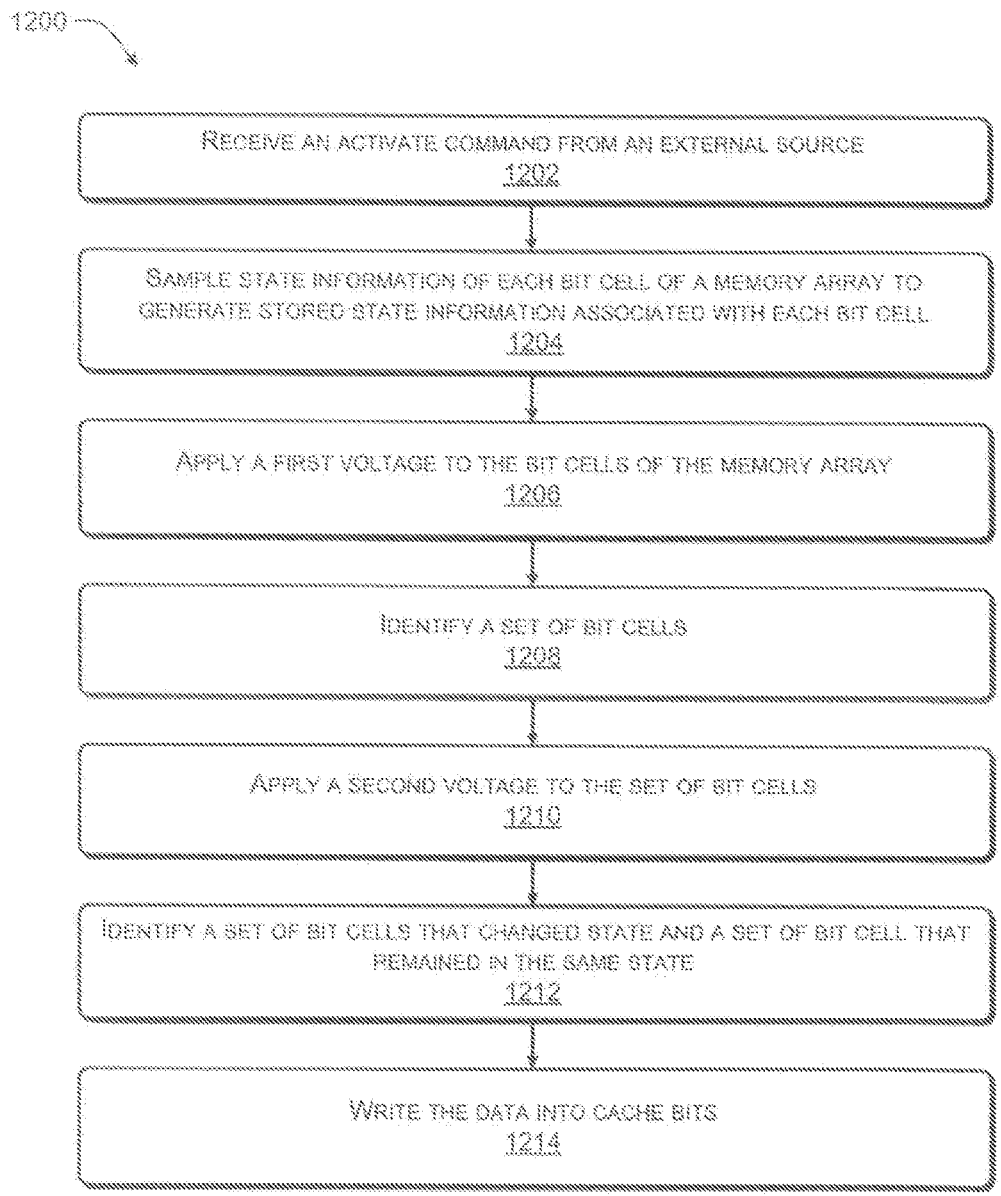
FIG. 12 illustrates another example flow diagram showing an illustrative process associated with storing data in one or more memory arrays according to some implementations.

FIG. 12 illustrates another example flow diagram showing an illustrative process 1200 associated with storing data in one or more memory arrays according to some implementations. For example a memory device may be configured to write cache bits into bit cells of a memory array according to a predetermined series or sequence of commands. In some particular implementations, the predetermined series or sequence of command may include an activate-read/write-precharge sequence.

At 1202, a memory device receives an activate command form the external source. For example, as discussed above with respect to FIG. 5, the activate command may cause the memory device to perform activate operations associated with opening a page by, for instance, loading state information from the bit cells of the memory array into a cache.

At 1204, the memory device performs the activate operations and samples state information of each bit cell of a memory array being accessed by the external source. The memory device then stores the state information associated with each of the bit cells. For example, the memory device may generate the state information of each bit cell by biasing the bit cells and measuring a current or resistance associated with each.

At 1206, the memory device applies a first voltage to the bit cells of the memory array. The first voltage is intended to switch each of the bit cells of the memory array to the same state. For example, the first voltage may be a down voltage intended to place each of the bit cells not already in the low resistive state into the low resistive state. In other examples, the first voltage may be an up voltage intended to place each of the bit cells not already in the high resistive state into the high resistive state. In some cases, the first voltage may have a first duration that may be of insufficient length and/or a first magnitude that may be of insufficient strength to switch each of the bit cells of the memory arrays to the second state. In other cases, the combination of the first duration and the first magnitude may be insufficient to switch one hundred percent of the bit cells. For example, the first duration may be less than a first threshold duration and the first magnitude may be less than a first magnitude threshold. In some cases, the first threshold duration may be a duration or length of time estimated to switch the state of about eighty five percent of the bit cells, ninety percent of the bit cells, ninety five percent of the bit cells, ninety nine percent of the bit cells, ninety nine point nine percent of the bit cells, etc. Similarly, the first threshold magnitude may be set at a magnitude estimated to switch the state of about eighty five percent of the bit cells, ninety percent of the bit cells, ninety five percent of the bit cells, ninety nine percent of the bit cells, ninety nine point nine percent of the bit cells, etc.

At 1208, the memory device identifies a set of bit cells. The set of bit cells are bit cells that did not change state following the application of the first voltage. For instance, the memory device may be configured to once again bias the bit cells and measure a current or resistance of each bit cell. The memory device may then compare the stored state information with measured current or resistance to identify the set of bit cells that did not change states. In this example, the set of bit cells includes both bit cells that were already in the first state (e.g., bit cells whose state information should have remained the same) and bit cells in the second state that the first voltage failed to switch (e.g., bit cells whose state information should have changed).

At 1210, the memory device applies a second voltage to the set of bit cells. In some cases, the second voltage has a second duration that may be configured based at least in part on the first duration and/or a second magnitude that may be configured based in part on the first magnitude. For instance, the second duration may be longer than the first duration and the second magnitude may be larger than the first magnitude. For example, the second duration may be longer than the first threshold duration and the second magnitude may be greater than the first threshold magnitude. In other cases, the second duration may be longer than a second threshold duration and the second magnitude may be greater than a second threshold magnitude. For instance, the second threshold duration may be set to a length sufficient to switch or set one hundred percent of the bit cells and/or the second threshold magnitude may be set to a level sufficient to switch or set one hundred percent of the bit cells. In this manner, the memory device is able to apply a first voltage having a shorter duration, lower magnitude, or both to at least some of the bit cells, thereby extending the time period associated with the dielectric breakdown of the MTJs and extending the usable lifetime of the memory device.

At 1212, the memory device identifies a set of bit cells that changed state and a set of bit cells that remained in the same state. For instance, the memory device may identify the set of bit cells that changed state and the set of bit cells that remained in the same state, by again biasing the bit cells and measuring a current or resistance of each bit after both the first and second voltages have been applied and comparing the stored state information to the measured current or resistance. In this manner, the memory device is able to identify which bit cells to read as a high value and which to read as a low value.

At 1214, the memory device writes the data into the cache bits. For example, once the data is stored in the cache bits, the external source may issue read and/or write command to access and/or edit the data. Following the read/write commands, the memory device receives a precharge command to cause the memory device to write the data in the cache bits back into the memory array.

Figure 13:
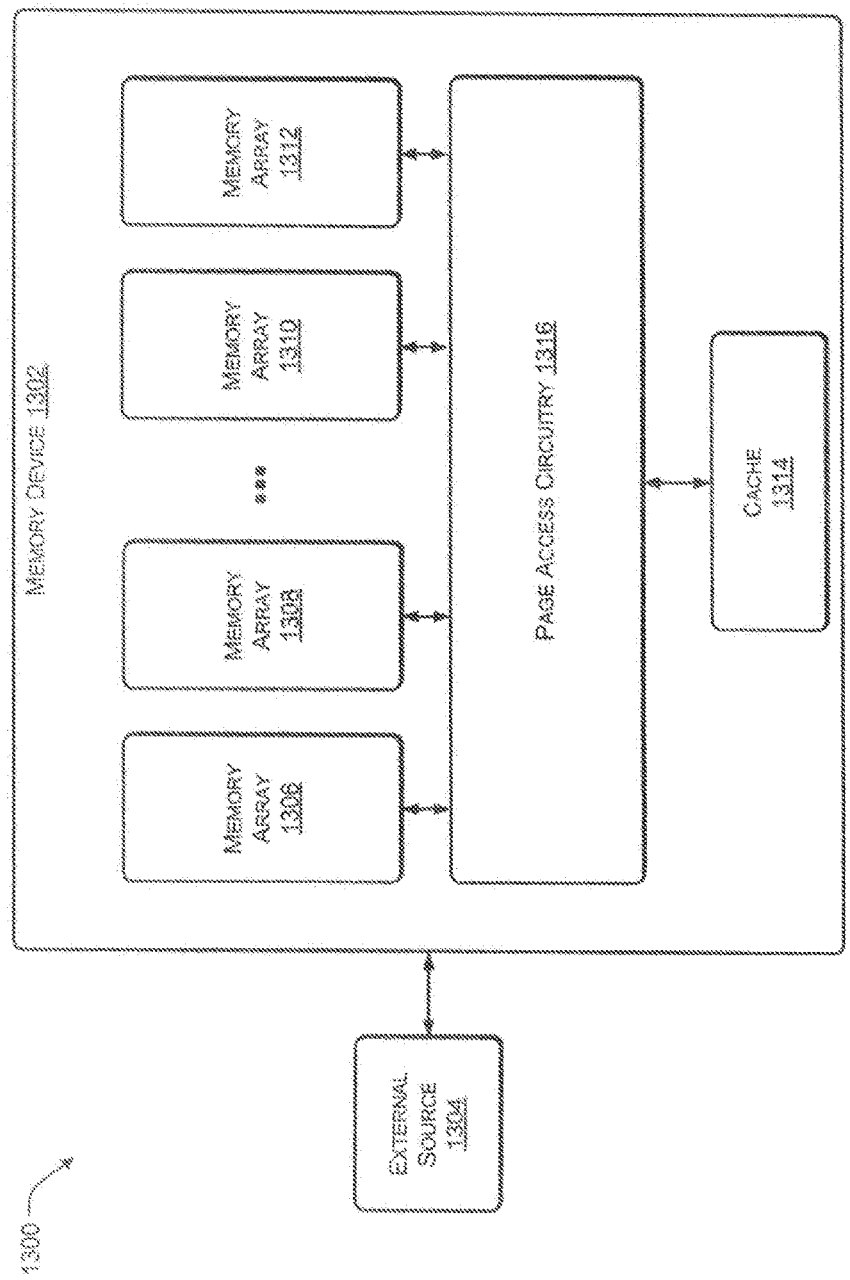
FIG. 13 illustrates an example block diagram of select components of a memory device accessible to an external source.

FIG. 13 illustrates an example block diagram 1300 of select components of a memory device 1302 accessible to an external source 1304. In the illustrated example, the memory device 1302 includes memory arrays 1306, 1308, 1310, and 1312, as well as cache 1314 and page access circuitry 1316. In general, the page access circuitry 1316 may be configured to loading data form the memory arrays 1306-1312 into the cache 1314 in response to receiving an activate command from the external source 1304. The memory device may also be configured to write data stored in the cache 1314 back into the corresponding memory array 1306-1312 in response to receiving a precharge command from the external source 1304.

The memory device 1302 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that can be used to store information. In one particular example, the memory device may be a magnetic memory or magnetic disk storage, such as an MRAM device.

In general, the page access circuitry 1316 is configured to apply a first voltage and a second voltage to the bit cells of the memory arrays 1306-1312 when loading data into the cache 1314, as described above with respect to FIGS. 6 and 13. For instance, the page access circuitry 1316 may perform self-referenced reads by sampling state information associated with each bit cell storing data being loaded into the cache 1314 and storing the state information. The page access circuitry 1316 may then apply a first voltage to switch the state of each bit cell to the low resistive state (or, alternatively, to the high resistive state) and evaluate the state information of each bit cell by comparing the current state information to the stored state information to identify a set of bit cells that did not change state. Once the set of bit cells are identified, the page access circuitry 1316 may apply a second voltage of greater duration and/or magnitude than the first voltage to the set of bit cells. Then the page access circuitry 1316 may identify the values stored on each bit cell by re-evaluating the state information of each bit cell by comparing the current state information to the stored state information to identify a set of bit cells that did not change state (e.g., a bit cell storing a low value) and a set of bit cells that did change state (e.g., a bit cell storing a high value).

The page access circuitry 1316 may also be configured to apply a first voltage and a second voltage to the bit cells of the memory arrays 1306-1312 when writing data back into the bit cells form the cache 1314, as described above with respect to FIGS. 5 and 12. For instance, the page access circuitry 1316 may determine a set of bit cells to place in the low resistive state and a set of bit cells to place in the high resistive state. The page access circuitry 1316 may then apply a first up voltage to the set of bit cells to place in the high resistive state and a first down voltage to the set of bit cells to place in the low resistive state. Once the first up and the first down voltages are applied, the page access circuitry 1316 may identify a first subset of bit cells that did not switch form the low resistive state to the high resistive state and a second subset of bit cells that did not switch form the high resistive state to the low resistive state. The page access circuitry 1316 may then apply a second up voltage having a greater duration and/or magnitude than the first up voltage to the first subset of bit cells and apply a second down voltage having a greater duration and/or magnitude than the first down voltage to the second subset of bit cells.

Figure 14:
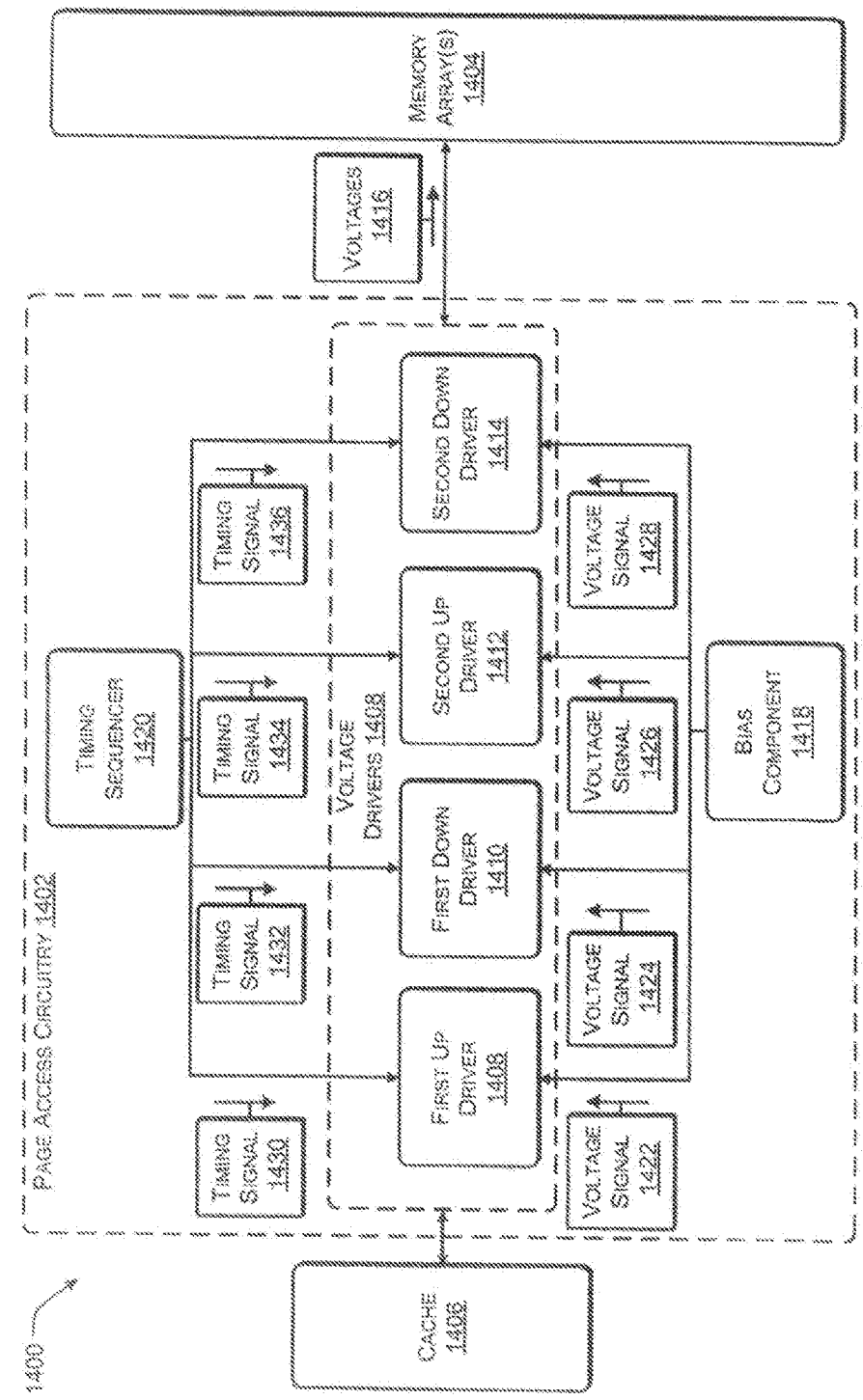
FIG. 14 illustrates another example block diagram of select components of a memory device accessible to an external source.

FIG. 14 illustrates another example block diagram of select components of a memory device 1400 accessible to an external source. In the illustrated example, the memory device 1400 includes page access circuitry 1402 that may be configured to load data form memory arrays 1404 into a cache 1406 in response to receiving an activate command from the external source 1404. The memory device may also be configured to write data stored in the cache 1406 back into the corresponding memory array 1404 in response to receiving a precharge command form the external source.

In general, the page access circuitry 1402 includes a first up driver 1406, a first down driver 1410, a second up driver 1412, and a second down driver 1414 for generating voltages 1416 (e.g., up and down voltages, respectively) to switch the state of the bit cells of the memory arrays 1404 when accessed, as described above. The drivers 1408-1414 generate the voltages 1416 based in part on input received from a bias component 1418 and/or a timing sequencer 1420. For example, the bias component 1418 may be configured to provide voltage signals 1422, 1424, 1426, and 1428 to the drivers 1408-1414 to indicate a magnitude of the voltages 1416 generated by each driver 1408-1414. Similarly, the timing sequencer 1420 may be configured to provide timing signals 1430, 1432, 1434, and 1436 to the drivers 1408-1414 to indicate a duration to apply the voltages 1416 generated by each driver 1408-1414.

In one example, the page access circuitry 1402 may receive a command to write the data stored in the cache 1406 into particular bit cells of the memory arrays 1404. During a first period of time, the page access circuitry 1402 may then identify a first set of bit cell to be placed in the high resistive state and a second set of bit cells to be placed in the low resistive state. In this example, the timing sequencer 1420 provides the timing signal 1430 to the first up driver 1408 and the timing signal 1432 to the first down driver 1410. Likewise, the bias component 1418 provides the voltage signal 1422 to the first up driver 1408 and the voltage signal 1424 to the first down driver 1410. Based at least in part on the timing signal 1430 and the voltage signal 1422, the first up driver 1408 provides voltages 1416 of a first magnitude for a first duration to the bit cells of the first set of bit cells. Similarly, based at least in part on the timing signal 1432 and the voltage signal 1424, the first down driver 1410 provides voltages 1416 of a second magnitude for a second duration to the bit cells of the second set of bit cells. In some cases, the first and second magnitudes may be the same. In other examples, the first and second magnitudes may differ; for instance, when the voltages 1416 required to set a bit cell from the low resistive state to the high resistive state differ from the voltages 1416 required to set a bit cell from the high resistive state to the low resistive state.

During a second period of time after the expiration of the first period of time, the page access circuitry 1402 may identify a first subset of bit cells that were not placed in the high resistive state by the first up driver 1408 and a second subset of bit cells that were not placed in the low resistive state by the first down driver 1408. In this example, the timing sequencer 1420 provides the timing signal 1434 to the second up driver 1412 and the timing signal 1436 to the second down driver 1414. Likewise, the bias component 1418 provides the voltage signal 1426 to the second up driver 1412 and the voltage signal 1428 to the second down driver 1414. Based at least in part on the timing signal 1434 and the voltage signal 1426, the second up driver 1412 provides voltages 1416 of a third magnitude for a third duration to the bit cells of the first subset of bit cells. Similar, based at least in part on the timing signal 1436 and the voltage signal 1428, the second down driver 1414 provides voltages 1416 of a fourth magnitude for a fourth duration to the bit cells of the second subset of bit cells. In general, the third magnitude is greater than the first magnitude and the third duration is greater than the first duration to ensure the bit cells of the first subset are placed in the high resistive state. Likewise, the fourth magnitude is greater than the second magnitude and the fourth duration is greater than the second duration to ensure the bit cells of the second subset are placed in the low resistive state. In some cases, the third and fourth magnitudes may be the same. In other examples the third and fourth magnitudes may differ; for instance, when the voltages 1416 required to set a bit cell from the low resistive state to the high resistive state differs from the voltages 1416 required to set a bit cell from the high resistive state to the low resistive state.

In some implementations, the drivers 1408-1414, the bias component 1418, and the timing sequencer 1420 may also be utilized to generate voltages 1416 of differing magnitude and/or duration with respect to writing data from the cache 1406, as described above with respect to FIGS. 6 and 12. Additionally, in the illustrated example, two up drivers 1408 and 1412 and two down drivers 1410 and 1412 are shown. However, in another example, one up driver may be configured to generate the voltages 1416 having both the first magnitude and duration and the third magnitude and duration and one down driver may be configured to generate the voltages 1416 having both the second magnitude and duration and the fourth magnitude and duration. In other examples, a single driver may be configured to generate both the up and down voltages. Similarly, the bias component 1418 may include multiple components to generate each of the voltage signals 1422-1428 and the timing sequencer 1420 may include multiple sequencers for generating the timing signals 1430-1436.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A method comprising:
    evaluating a state of each bit cell of a plurality of bit cells of one or more memory arrays, wherein the step of evaluating the state of each bit cell includes performing a self-referenced read operation to set each bit cell of the plurality of bit cells in a single state;
    receiving, at a memory device, data targeted for storage in the plurality of bit cells, wherein each bit cell is configured to store data in a first state or a second state;
    identifying, based at least in part on the received data, a set of bit cells of the plurality of bit cells that are in a state opposite to a state of the data targeted for storage in the set of bit cells;
    applying a first voltage to the set of bit cells, wherein the first voltage includes a first duration and a first magnitude;
    evaluating a state of one or more bit cells of the set of bit cells to identify a subset of bit cells that contains each bit cell in the set that remains in the state opposite to the state of the data targeted for storage in the set of bit cells; and
    applying a second voltage to the subset of bit cells, wherein the second voltage includes a second duration and a second magnitude.

2. The method of claim 1, wherein at least one of the second duration and the second magnitude is greater than the first duration and the first magnitude, respectively.

3. The method of claim 1, wherein the first duration or the first magnitude is insufficient to switch each bit cell in the set of bit cells from the state opposite to the state of the data targeted for storage in the set of bit cells to a state that corresponds to the state of the data targeted for storage in the set of bit cells.

4. The method of claim 1, wherein the second duration or the second magnitude is configured to switch each bit cell in the set of bit cells from the state opposite to the state of the data targeted for storage in the set of bit cells to a state that corresponds to the state of the data targeted for storage in the set of bit cells.

5. The method of claim 1, wherein the received data includes a write command, a write back command, or a precharge command; and
    wherein the data targeted for storage in the plurality of bit cells includes data from a cache.

6. The method of claim 1, wherein evaluating the state of each bit cell of the set of bit cells to identify the subset of bit cells includes a referenced read operation.

7. The method of claim 1, wherein evaluating the state of each bit cell of the set of bit cells to identify the subset of bit cells includes comparing a current associated with each bit cell prior to applying the first voltage to a current associated with each bit cell subsequent to applying the first voltage.

8. The method of claim 1, wherein the first state is a low resistive state, and the second state is a high resistive state.

9. The method of claim 1, wherein the bit cells configured to store data in the first state are a first set of bit cells, wherein the bit cells configured to store data in the second state are a second set of bit cells, and further including:
    identifying a first subset of bit cells from the first set of bit cells, wherein the first subset of bit cells contains each bit cell in the first set that remains in the second state, and identifying a second subset of bit cells from the second set of bit cells, wherein the second subset of bit cells contains each bit cell in the second set that remains in the first state;
    applying a third voltage to each bit cell of the first subset of bit cells to change each bit cell of the first subset of bit cells from the second state to the first state, wherein the third voltage includes a third magnitude and a third duration, and wherein at least one of the third magnitude and the third duration is greater than the first magnitude and the first duration, respectively; and
    applying a fourth voltage to each bit cell of the second subset of bit cells to change each bit cell of the second subset of bit cells from the first state to the second state, wherein the fourth voltage includes a fourth magnitude and a fourth duration, and wherein at least one of the fourth magnitude and the fourth duration is greater than the second magnitude and the second duration, respectively.

10. The method of claim 9, wherein the data targeted for storage in the plurality of bit cells is accessed from a cache in response to a precharge command, a command issued to the memory device from an external device, or a command issued internally by the memory device.

11. The method of claim 9, wherein the magnitude or duration of the third voltage is configured to set each bit cell of the first subset of bit cells to the first state; and
    wherein the magnitude or duration of the fourth voltage is configured to set each bit cell of the second subset of bit cells to the second state.

12. The method of claim 9, wherein the first state is a high resistive state, and the second state is a low resistive state.

13. The method of claim 9, wherein the first state is a low resistive state, and the second state is a high resistive state.

14. The method of claim 9, wherein one or more of the identifying steps includes sampling a state of each bit cell of the plurality of bit cells.

15. The method of claim 9, wherein the first voltage is applied in a first direction, and the second voltage is applied in a second direction opposite to the first direction; and
    wherein each bit cell of the plurality of bit cells is a magnetic tunnel junction.

16. The method of claim 9, wherein identifying the first set of bit cells, identifying the second set of bit cells, identifying the first subset of bit cells, and/or identifying the second subset of bit cells includes a referenced read operation.

17. A memory device comprising:
    at least one memory array having a plurality of bit cells; and
    page access circuitry coupled to the at least one memory array and a cache, wherein the page access circuitry is configured to:
        receive data targeted for storage in the plurality of bit cells of the at least one memory array, wherein each bit cell is configured to store data in a first state or a second state;
        identify, based at least in part on the received data, a set of bit cells of the plurality of bit cells that are in a state opposite to a state of the data targeted for storage in the set of bit cells;

apply a first voltage to the set of bit cells, wherein the first voltage includes a first duration and a first magnitude;

evaluate a state of one or more bit cells of the set of bit cells to identify a subset of bit cells that contains each bit cell in the set that remains in the state opposite to the state of the data targeted for storage in the set of bit cells by comparing a current associated with each bit cell prior to applying the first voltage to a current associated with each bit cell subsequent to applying the first voltage; and apply a second voltage to the subset of bit cells, wherein the second voltage includes a second duration and a second magnitude.

18. The memory device of claim 17, wherein at least one of the second duration and the second magnitude is greater than the first duration and the first magnitude, respectively.

19. The memory device of claim 17, wherein the page access circuitry is configured to perform a preliminary step of evaluating a state of each bit cell of the plurality of bit cells, wherein evaluating the state of each bit cell includes performing a self-referenced read operation to set each bit cell of the plurality of bit cells in a single state.

20. A method comprising:

receiving, at a memory device, data targeted for storage in a plurality of bit cells of one or more memory arrays, wherein each bit cell is configured to store data in a first state or a second state;

identifying, based at least in part on the received data, a set of bit cells of the plurality of bit cells that are in a state opposite to a state of the data targeted for storage in the set of bit cells;

applying a first voltage to the set of bit cells, wherein the first voltage includes a first duration and a first magnitude;

evaluating a state of one or more bit cells of the set of bit cells to identify a subset of bit cells that contains each bit cell in the set that remains in the state opposite to the state of the data targeted for storage in the set of bit cells by comparing a current associated with each bit cell prior to applying the first voltage to a current associated with each bit cell subsequent to applying the first voltage; and applying a second voltage to the subset of bit cells, wherein the second voltage includes a second duration and a second magnitude.

21. The method of claim 20, wherein, prior to receiving data targeted for storage in the plurality of bit cells, the method further comprises:

evaluating a state of each bit cell of the plurality of bit cells, wherein the step of evaluating the state of each bit cell includes performing a self-referenced read operation to set each bit cell of the plurality of bit cells in a single state.

22. The method of claim 20, wherein the received data includes a write command, a write back command, or a precharge command; and wherein the data targeted for storage in the plurality of bit cells includes data from a cache.

\* \* \* \* \*